US011117195B2

(12) United States Patent
Sutcliffe et al.

(10) Patent No.: US 11,117,195 B2
(45) Date of Patent: Sep. 14, 2021

(54) SYSTEM AND PROCESS FOR IN-PROCESS ELECTRON BEAM PROFILE AND LOCATION ANALYSES

(71) Applicants: Howmedica Osteonics Corp., Mahwah, NJ (US); The University Of Liverpool, Liverpool (GB)

(72) Inventors: Christopher J. Sutcliffe, Liverpool (GB); Eric Jones, Limerick (IE); Hay Wong, Liverpool (GB)

(73) Assignees: The University Of Liverpool; Howmedica Osteonics Corp., Mahwah, NJ (US)

( * ) Notice: Subject to any disclaimer, the term of this patent is extended or adjusted under 35 U.S.C. 154(b) by 25 days.

(21) Appl. No.: 16/515,725

(22) Filed: Jul. 18, 2019

(65) Prior Publication Data
US 2020/0023435 A1 Jan. 23, 2020

Related U.S. Application Data

(60) Provisional application No. 62/700,383, filed on Jul. 19, 2018.

(51) Int. Cl.
*B33Y 50/02* (2015.01)
*B22F 10/20* (2021.01)
(Continued)

(52) U.S. Cl.
CPC ............ *B22F 10/20* (2021.01); *B23K 15/002* (2013.01); *B23K 15/0086* (2013.01);
(Continued)

(58) Field of Classification Search
CPC ......... B33Y 50/00; B33Y 50/02; B33Y 30/00; B23K 15/0013; B23K 15/002; B23K 15/0086; B23K 15/06
See application file for complete search history.

(56) References Cited

U.S. PATENT DOCUMENTS 3,381,132 A 4/1968 Okano
3,381,136 A 4/1968 Carbone et al.
(Continued)

FOREIGN PATENT DOCUMENTS

CN 106180718 A 12/2016
DE 102010027910 A1 10/2011
(Continued)

OTHER PUBLICATIONS

Extended European Search Report for Application No. EP19187134. 2, dated Nov. 27, 2019, pp. 1-5.
(Continued)

*Primary Examiner* — Eliza W Osenbaugh-Stewart
(74) *Attorney, Agent, or Firm* — Lerner, David, Littenberg, Krumholz & Mentlik, LLP

(57) ABSTRACT

A High Energy Beam Processing (HEBP) system provides feedback signal monitoring and feedback control for the improvement of process repeatability and three-dimensional (3D) printed part quality. Electrons deflected from a substrate in the processing area impinge on a surface of a sensor. The electrons result from the deflection of an electron beam from the substrate. Either one or both of an initial profile of an electron beam and an initial location of the electron beam relative to the substrate are determined based on a feedback electron signal corresponding to the impingement of the electrons on the surface of the sensor. With an appropriate profile and location of the electron beam, the build structure is fabricated on the substrate.

19 Claims, 12 Drawing Sheets

(51) Int. Cl.
  *B33Y 30/00* (2015.01)
  *B23K 15/00* (2006.01)
  *B23K 15/02* (2006.01)
  *B23K 15/06* (2006.01)
  *G01N 23/2206* (2018.01)
  *G01N 23/2208* (2018.01)
  *B22F 10/30* (2021.01)

(52) U.S. Cl.
  CPC .............. *B23K 15/02* (2013.01); *B23K 15/06* (2013.01); *B33Y 30/00* (2014.12); *B33Y 50/02* (2014.12); *G01N 23/2206* (2013.01); *G01N 23/2208* (2013.01); *B22F 10/30* (2021.01)

(56) References Cited

U.S. PATENT DOCUMENTS

| | | | |
|---|---|---|---|
| 4,233,515 A | 11/1980 | Dietrich et al. | |
| 4,348,576 A | 9/1982 | Anderl et al. | |
| 4,658,136 A | 4/1987 | Ohtaka et al. | |
| 4,658,137 A | 4/1987 | Garth et al. | |
| 4,700,075 A | 10/1987 | Kurz et al. | |
| 4,714,833 A | 12/1987 | Rose et al. | |
| 4,721,842 A | 1/1988 | Farrell | |
| 4,794,259 A | 12/1988 | Sanderson et al. | |
| 4,843,246 A | 6/1989 | Benes et al. | |
| 4,862,741 A | 9/1989 | Heusser | |
| 4,927,992 A | 5/1990 | Whitlow et al. | |
| 4,983,833 A | 1/1991 | Brunner et al. | |
| 4,998,004 A | 3/1991 | Lawrence et al. | |
| 5,345,085 A | 9/1994 | Prior | |
| 5,483,036 A | 1/1996 | Giedt et al. | |
| 5,502,306 A | 3/1996 | Meisburger et al. | |
| 5,583,427 A | 12/1996 | Teruya et al. | |
| 5,657,138 A | 8/1997 | Lewis et al. | |
| 5,842,224 A | 11/1998 | Fenner | |
| 6,025,593 A | 2/2000 | Suzuki et al. | |
| 6,065,795 A | 5/2000 | Forster et al. | |
| 6,114,695 A | 9/2000 | Todokoro et al. | |
| 6,122,564 A | 9/2000 | Koch et al. | |
| 6,172,363 B1 | 1/2001 | Shinada et al. | |
| 6,300,755 B1 | 10/2001 | Elmer et al. | |
| 6,329,826 B1 | 12/2001 | Shinada et al. | |
| 6,399,945 B1 | 6/2002 | Hirayanagi | |
| 6,410,105 B1 | 6/2002 | Mazumder et al. | |
| 6,459,951 B1 | 10/2002 | Griffith et al. | |
| 6,469,919 B1 | 10/2002 | Bennett | |
| 6,498,345 B1 | 12/2002 | Weimer et al. | |
| 6,559,663 B2 | 5/2003 | Shinada et al. | |
| 6,646,261 B2 | 11/2003 | Krans | |
| 6,649,919 B2 | 11/2003 | Chao et al. | |
| 6,674,075 B2 | 1/2004 | Petrov et al. | |
| 6,710,280 B2 | 3/2004 | Mazumder et al. | |
| 6,815,636 B2 | 11/2004 | Chung et al. | |
| 6,977,382 B2 | 12/2005 | Lower | |
| 7,026,830 B2 | 4/2006 | Shinada et al. | |
| 7,141,791 B2 | 11/2006 | Masnaghetti et al. | |
| 7,171,038 B2 | 1/2007 | Adler et al. | |
| 7,211,797 B2 | 5/2007 | Nishiyama et al. | |
| 7,227,142 B2 | 6/2007 | Parker | |
| 7,244,949 B2 | 7/2007 | Knippelmeyer et al. | |
| 7,397,252 B2 | 7/2008 | Zhou | |
| 7,399,966 B2 | 7/2008 | Todokoro et al. | |
| 7,417,444 B2 | 8/2008 | Shinada et al. | |
| 7,435,956 B2 | 10/2008 | Parker | |
| 7,449,690 B2 | 11/2008 | Nishiyama et al. | |
| 7,454,262 B2 | 11/2008 | Larsson | |
| 7,456,402 B2 | 11/2008 | Parker et al. | |
| 7,462,828 B2 | 12/2008 | Fukada et al. | |
| 7,515,986 B2 | 4/2009 | Huskamp | |
| 7,521,677 B2 | 4/2009 | Walter et al. | |
| 7,521,679 B2 | 4/2009 | Nishiyama et al. | |
| 7,537,722 B2 | 5/2009 | Andersson et al. | |
| 7,540,738 B2 | 6/2009 | Larsson et al. | |
| 7,554,094 B2 | 6/2009 | Knippelmeyer et al. | |
| 7,569,819 B2 | 8/2009 | Mori | |
| 7,635,825 B2 | 12/2009 | Larsson | |
| 7,642,828 B2 | 1/2010 | Sakai | |
| 7,692,166 B2 | 4/2010 | Muraki et al. | |
| 7,713,454 B2 | 5/2010 | Larsson | |
| 7,883,465 B2 | 2/2011 | Donofrio et al. | |
| 7,892,179 B2 | 2/2011 | Rieth | |
| 7,902,503 B2 | 3/2011 | Teruya et al. | |
| 7,928,404 B2 | 4/2011 | Parker | |
| 7,952,074 B2 | 5/2011 | Shinada et al. | |
| 7,982,179 B2 | 7/2011 | Adamec et al. | |
| 8,039,813 B2 | 10/2011 | Casares et al. | |
| 8,062,715 B2 | 11/2011 | Skszek et al. | |
| 8,097,847 B2 | 1/2012 | Knippelmeyer et al. | |
| 8,153,969 B2 | 4/2012 | Fukada et al. | |
| 8,187,521 B2 | 5/2012 | Larsson et al. | |
| 8,308,466 B2 | 11/2012 | Ackelid et al. | |
| 8,314,358 B2 | 11/2012 | Loewer et al. | |
| 8,330,104 B2 | 12/2012 | Matsumoto | |
| 8,431,894 B2 | 4/2013 | Essers et al. | |
| 8,452,073 B2 | 5/2013 | Taminger et al. | |
| 8,461,474 B2 | 6/2013 | Wollenhaupt et al. | |
| 8,530,851 B2 | 9/2013 | Abgaryan et al. | |
| 8,546,717 B2 | 10/2013 | Stecker | |
| 8,570,534 B1 | 10/2013 | Loewgren | |
| 8,598,523 B2 | 12/2013 | Stecker et al. | |
| 8,604,431 B2 | 12/2013 | Murakawa et al. | |
| 8,637,834 B2 | 1/2014 | Knippelmeyer et al. | |
| 8,641,474 B2 | 2/2014 | Lam | |
| 8,648,300 B2 | 2/2014 | Isawa et al. | |
| 8,809,780 B2 | 8/2014 | Wollenhaupt et al. | |
| 8,831,179 B2 | 9/2014 | Adler et al. | |
| 8,845,316 B2 | 9/2014 | Schillen et al. | |
| 8,878,094 B2 | 11/2014 | Bagavath-Singh | |
| 8,955,622 B2 | 2/2015 | Schroder | |
| 8,992,816 B2 | 3/2015 | Jonasson et al. | |
| 9,064,671 B2 | 6/2015 | Ljungblad et al. | |
| 9,073,265 B2 | 7/2015 | Snis | |
| 9,079,248 B2 | 7/2015 | Ackelid | |
| 9,099,282 B2 | 8/2015 | Rogers et al. | |
| 9,126,167 B2 | 9/2015 | Ljungblad | |
| 9,142,382 B2 | 9/2015 | Adler et al. | |
| 9,153,413 B2 | 10/2015 | Almogy et al. | |
| 9,162,393 B2 | 10/2015 | Ackelid | |
| 9,170,503 B2 | 10/2015 | Adler et al. | |
| 9,174,300 B2 | 11/2015 | Stecker et al. | |
| 9,202,669 B2 | 12/2015 | Hirato et al. | |
| 9,224,576 B2 | 12/2015 | Knippelmeyer et al. | |
| 9,310,188 B2 | 4/2016 | Snis | |
| 9,324,537 B2 | 4/2016 | Kemen et al. | |
| 9,336,981 B2 | 5/2016 | Knippelmeyer | |
| 9,336,982 B2 | 5/2016 | Zeidler et al. | |
| 9,341,467 B2 | 5/2016 | Snis | |
| 9,347,770 B2 | 5/2016 | Snis | |
| 9,347,794 B1 | 5/2016 | Tiana et al. | |
| 9,347,974 B2 | 5/2016 | Reisgen et al. | |
| 9,383,460 B2 | 7/2016 | McAninch et al. | |
| 9,384,938 B2 | 7/2016 | Zeidler et al. | |
| 9,399,264 B2 | 7/2016 | Stecker | |
| 9,399,321 B2 | 7/2016 | Ljungblad | |
| 9,406,483 B1 | 8/2016 | Lock | |
| 9,415,443 B2 | 8/2016 | Ljungblad et al. | |
| 9,455,120 B2 | 9/2016 | Schertel | |
| 9,468,973 B2 | 10/2016 | Ljungblad | |
| 9,505,057 B2 | 11/2016 | Nordkvist et al. | |
| 9,505,172 B2 | 11/2016 | Ljungblad | |
| 9,543,116 B2 | 1/2017 | Lock | |
| 9,550,207 B2 | 1/2017 | Ackelid | |
| 9,802,253 B2 | 10/2017 | Jonasson | |
| 10,046,412 B2 | 8/2018 | Blackmore | |
| 10,071,437 B2 | 9/2018 | Stecker et al. | |
| 10,113,981 B2 | 10/2018 | Mitchell | |
| 10,434,572 B2 | 10/2019 | Ljungblad | |
| 10,434,598 B2 | 10/2019 | Baudimont et al. | |
| 2005/0173650 A1* | 8/2005 | Lower .................. | B23K 15/00 250/397 |
| 2007/0230768 A1 | 10/2007 | Adler et al. | |
| 2010/0260410 A1 | 10/2010 | Taminger et al. | |
| 2013/0071791 A1 | 3/2013 | Arita et al. | |

(56) References Cited

U.S. PATENT DOCUMENTS

| | | | |
|---|---|---|---|
| 2013/0134323 A1 | 5/2013 | Abgaryan et al. | |
| 2014/0265040 A1 | 9/2014 | Batchelder | |
| 2014/0314964 A1 | 10/2014 | Ackelid | |
| 2015/0034606 A1 | 2/2015 | Blackmore | |
| 2015/0037599 A1 | 2/2015 | Blackmore | |
| 2015/0037601 A1* | 2/2015 | Blackmore | H01J 37/304 428/600 |
| 2015/0051599 A1 | 2/2015 | Joseph | |
| 2015/0100149 A1 | 4/2015 | Coeck et al. | |
| 2015/0165325 A1 | 6/2015 | Yamamura et al. | |
| 2015/0165525 A1 | 6/2015 | Jonasson | |
| 2015/0174658 A1 | 6/2015 | Ljungblad | |
| 2015/0258626 A1 | 9/2015 | Seufzer et al. | |
| 2015/0287568 A1 | 10/2015 | Rodgers et al. | |
| 2015/0306699 A1 | 10/2015 | Honda | |
| 2016/0016254 A1 | 1/2016 | Stecker et al. | |
| 2016/0124026 A1 | 5/2016 | Mullen et al. | |
| 2016/0211116 A1 | 7/2016 | Lock | |
| 2016/0288244 A1 | 10/2016 | Stecker | |
| 2017/0023499 A1 | 1/2017 | Mitchell | |
| 2017/0066051 A1 | 3/2017 | Ackelid et al. | |
| 2017/0087661 A1* | 3/2017 | Backlund | H01J 37/305 |
| 2017/0136574 A1 | 5/2017 | Zenzinger et al. | |
| 2019/0001655 A1 | 1/2019 | Blom et al. | |
| 2019/0375016 A1 | 12/2019 | Ljungblad | |
| 2020/0023435 A1 | 1/2020 | Sutcliffe et al. | |
| 2020/0038953 A1 | 2/2020 | Pavan et al. | |
| 2020/0215810 A1* | 7/2020 | Sutcliffe | H02S 40/22 |

FOREIGN PATENT DOCUMENTS

| | | |
|---|---|---|
| DE | 102013107454 A1 | 1/2015 |
| EP | 2832473 A1 | 2/2015 |
| EP | 2918396 A1 | 9/2015 |
| EP | 3157041 A1 | 4/2017 |
| EP | 3323617 A1 | 5/2018 |
| GB | 2132390 A | 7/1984 |
| WO | 1996008749 A2 | 7/1996 |
| WO | 2011059621 A1 | 5/2011 |
| WO | 2018217646 A1 | 11/2018 |
| WO | 2019209881 A1 | 10/2019 |

OTHER PUBLICATIONS

Wong H, Neary D, Jones E, Fox P, Sutcliffe C. Benchmarking spatial resolution in electronic imaging for potential in-situ Electron Beam Melting monitoring. Additive Manufacturing. Available Online Aug. 10, 2019;29:100829.

Wong H, Neary D, Jones E, Fox P, Sutcliffe C. Pilot feedback electronic imaging at elevated temperatures and its potential for in-process electron beam melting monitoring. Additive Manufacturing. Available Online Mar. 1, 2019;27:185-98.

Wong H, Neary D, Jones E, Fox P, Sutcliffe C. Pilot capability evaluation of a feedback electronic imaging system prototype for in-process monitoring in electron beam additive manufacturing. The International Journal of Advanced Manufacturing Technology. Available Online Sep. 27, 2018;100(1-4):707-20.

Wong H, Neary D, Shahzad S, Jones E, Fox P, Sutcliffe C. Pilot investigation of feedback electronic image generation in electron beam melting and its potential for in-process monitoring. Journal of Materials Processing Technology. Available Online Oct. 16, 2018;266:502-17.

International Search Report for Application No. PCT/US2018/033700, dated Aug. 21, 2018.

Arnold et al., "Layerwise monitoring of electron beam melting via backscatter electron detection", Rapid Prototyping Journal, vol. 24 Issue: 8, pp. 1401-1406, 2018.

Nandwana, Peeyush, et al., "Recylability Study on Inconel 18 and Ti-6AI-4V Powders for Use in Electron Beam Melting," Metallurgical and Materials Transactions B, 47(1) (2016), pp. 754-762.).

Alldredge et al., In-Situ Monitoring and Modeling of Metal Additive Manufacturing Powder Bed Fusion, AIP Conference Proceedings 1949, published online Apr. 20, 2018, pp. 020007-1-020007-8.

Berumen et al., Quality control of laser- and powder bed-based Additive Manufacturing (AM) technologies, Physics Procedia, 2010, vol. 5, part B, pp. 617-622.

Chivel et al., SLS process monitoring and adaptive control, InProceedings of the Fourth International WLT—Conference on Lasers in Manufacturing, Munich, Germany, Jan. 2007, 6 pages.

Everton et al., Review of in-situ process monitoring and in-situ metrology for metal additive manufacturing, Materials & Design, Apr. 2016, pp. 431-445, vol. 95.

Tapia et al., A Review on Process Monitoring and Control in Metal-Based Additive Manufacturing, Journal of Manufacturing Science and Engineering, Dec. 2014, pp. 060801-1-060801-10, vol. 136.

* cited by examiner

F: Solidified Melted Surface
G: Powder Bed

SYSTEM AND PROCESS FOR IN-PROCESS ELECTRON BEAM PROFILE AND LOCATION ANALYSES

CROSS-REFERENCE TO RELATED APPLICATION

The present application claims the benefit of the filing date of U.S. Provisional Patent Application No. 62/700,383 filed Jul. 19, 2018, the disclosure of which is hereby incorporated herein by reference.

FIELD OF THE INVENTION

The present invention generally relates to additive manufacturing, and in particular relates to a system for analyzing the profile and location of a high energy beam and for monitoring, interpreting, and controlling the fabrication of components by High Energy Beam Processing (HEBP).

BACKGROUND OF THE INVENTION

Additive Manufacturing (AM) is increasingly used in the development of new products across many industrial sectors such as the medical and aerospace industries. HEBP technologies can be used as one of the AM techniques to build three-dimensional (3D) parts as a series of two-dimensional (2D) layers via a layer-wise computer-controlled production process. HEBP machines used in AM will be referred to as High Energy Beam Additive Manufacturing (HEBAM) machines hereinafter. A HEBAM machine harnesses the energy of a beam to perform selective sintering or full melting to consolidate metallic powder. In order to be used in a HEBAM machine, a 3D design is modeled and programmatically divided into 2D cross-sectional layers. The design in the form of a set of 2D cross-sections is then imported to a HEBAM machine and successively processed to materialize the 3D design into a physical 3D object.

Among many possible HEBAM machine layouts, a Powder-Bed Fusion (PBF) set-up includes a powder deposition system having a moving rake, a roller or other spreading device, and powder containers. In order to process a 2D cross section, the powder deposition system is used to deposit a powder layer onto a substrate in a machine processing area. A high energy beam is focused onto a build platform and then deflected using computer-controlled electromagnetic lenses to trace out the geometry of the 2D cross-section of the 3D design. The energy of the beam causes a specific area of the powder layer within the traced-out geometry to be sintered or fully melted. Upon solidification of the traced-out areas within the current powder layer, the build platform lowers, and a new powder layer is deposited on the machine processing area. Three-dimensional objects can be built layer upon layer through the repetition of powder layer deposition and selective sintering or melting. FIG. 1 shows in part a schematic layout of a conventional HEBAM machine which employs high energy electrons as its energy source for selective sintering or melting.

Applications of AM techniques in various industries have been met by challenges caused by a lack of process repeatability and part quality reproducibility. Typical quality issues in AM processes include the formation of undesired porosity on melted surfaces as well as the delamination of layers, both of which affect mechanical properties and the geometry of AM-manufactured parts. Moreover, sublimation or evaporation of materials in layers being processed or adjacent to layers being processed can also occur during the melting process, which is often observed as metallization, i.e., metallic coatings attached to interior surfaces of a build chamber. Within an alloy, chemical constituents of the alloy have different thermal properties, meaning that sublimation or evaporation is non-uniform. (See Nandwana, Peeyush, et al., "Recyclability Study on Inconel 718 and Ti-6Al-4V Powders for Use in Electron Beam Melting," Metallurgical and Materials Transactions B, Vol. 47B (2016), pp. 754-762, the disclosure of which is hereby incorporated by reference herein). This non-uniformity could cause the chemical composition of the powder to be different than that of printed parts.

In the current state of the art, AM machines lack effective in situ process monitoring and control, which hinders the establishment of desired correlations between AM process parameters and AM-manufactured part characteristics, which include part geometry, processing area quality, and the chemical composition of printed parts. These deficiencies are among the major barriers inhibiting the adoption of AM techniques across industries. Selective Laser Additive Manufacturing (SLAM), including selective laser sintering and selective laser melting, and Electron Beam Additive Manufacturing (EBAM) are two common HEBP processes. While some in situ process monitoring methods are used for SLAM processes with the PBF set-up, these methods are not suitable for the EBAM process for two main reasons. First, the physics of interactions between the different energy source, i.e., the laser beam and the electron beam, and the powder itself are sufficiently different such that any in situ monitoring methods associated with a laser heat source are not readily applicable to a process using an electron beam as the heat source. Secondly, the above-noted sublimation and evaporation of the powder occurs more commonly during the EBAM process which requires a vacuum chamber. The metallization forms in vacuum more readily than in an inert gas environment used with laser-based processes. These metallic coatings would reduce the effectiveness or even damage typical SLAM sensors if they were to be integrated into an EBAM apparatus for monitoring and control purposes.

Some HEBAM machine manufacturers have been developing camera-based quality verification systems. This optical monitoring system is used to carry out post-processing part-geometry measurement. The system includes a camera that captures radiation with wavelength in both visible and near-infrared regions coming from the processing area, pneumatic shutters for protection of the camera lenses from evaporation of metallic materials during the HEBAM process, and software to carry out image analysis. The system captures digital optical images of the entire processing area of the HEBAM machine and provides some post-build indications regarding the level of porosity in solidified melted surfaces as well as the level of expansion or shrinkage of printed parts. However, this camera system lacks the ability to magnify an individual region of interest on the powder bed without compromising spatial resolution, and further lacks the capability to observe the chemical composition of the printed part or of the powder among other deficiencies.

Apart from the efforts made by machine manufacturers, academic communities have also carried out various research projects to build in situ HEBAM process control systems for monitoring either one or both of the quality and temperature stability of the liquid melt zone and part geometry. The systems developed in academia have thus far involved the use of camera to detect radiation with wavelengths either in the visible or infrared (IR) region. One of the major inherent drawbacks of collecting and making use of detected radiation with wavelengths either in the visible or IR region is that the spatial resolution near part boundaries of the generated digital optical image is influenced heavily by the radiation emitted from the Heat-Affected Zone (HAZ) surrounding the region of interest. This emitted radiation might result in blurred part boundaries in the digital optical images and affect the accuracy of part-geometry analysis.

In addition to the impact of the interface between a high energy beam and a part being fabricated during an EBAM process on the quality of the fabricated part, the quality and consistency of a high energy beam is one of the most important factors in determining the final quality of components manufactured using high energy beam melting processes. The generation and control of a high energy beam is a rather complex process. Two current methods used for assessing the quality of an electron beam for use with an EBAM process are the enhanced modified Faraday cup (EMFC) electron beam welding diagnostic and the electron beam verification processes.

The EMFC system receives a primary electron beam through thin slits on the top of a tungsten disc to effectively measure the beam's current, size, shape and peak power distribution. This system has generated a significant amount of informative data regarding beam parameters, including beam quality and previously unquantifiable beam interference factors. This data has led to a deeper understanding into the EBAM process and specifically how a high energy beam interacts with the powder bed to form a consistent melt pool. However, a major limitation with the EMFC system is that, due to the requirement for a beam undergoing testing to enter the tungsten disc at a specific angle, the EMFC is only able to analyze the beam in the center of a build area. Thus, an EBAM process relying on an EMFC system relies on a generally inaccurate assumption that the measured beam characteristics are accurately replicated across an entire build area over which a beam will travel during manufacturing of a component.

Moreover, use of a Faraday cup with in an EBAM process can easily add significant time to total production time each time a beam assessment is needed. Installing a Faraday cup requires opening a build chamber and pulling a vacuum in the chamber to eliminate the potential for ignition of highly flammable metallic particles in the chamber due to exposure to oxygen. These steps can add approximately forty (40) minutes to the production time. The build chamber also must be brought up to atmospheric pressure following the beam assessment to prepare for a build which can tack on an additional approximately five (5) minutes to the production time.

In the electron beam verification process, an electron beam is scanned across a stainless steel plate at relatively low beam energies, forming a number of predefined patterns. This process allows for limited beam characterization across an entire build area but is not sensitive to small changes in beam quality that may produce notable effects during an EBAM process. This process merely serves as verification that beam intensity and focus set points are in approximately the correct region in selected areas of the plate as the quantity of data generated by this process is insufficient to be used in the manufacture of reliably and reproducibly high quality components.

The calibration of the beam focusing system of a beam verification system is an important step that in essence dictates the dimensional accuracy and mechanical properties of a manufactured component. Beam calibration is a manually intensive process that is intended to ensure that the beam demonstrates the smallest spot size, most circular beam and highest intensity at any specified point across the build area. There is no constraint that the beam size, circularity, and intensity at each position are the same. This could mean that although the electron beam is as intense as possible at each calibration location, there may be variation across the bed, and just as importantly between machines. A further weakness of the beam calibration procedures is their dependence on operator skill leading to significant potential for error and lack of repeatability between successive beam calibrations.

In one recent advancement more fully described in U.S. Patent Publication No. 2016/0124026 A1, which is hereby incorporated by reference herein, a high energy beam verification, calibration, and profiling system includes a conductive base plate, supports extending from the base plate, and conductors supported by the supports such that the conductors are insulated from the base plate. The conductors have profiles that intersect with the profiles of other conductors to define a multidirectional and two-dimensional array of conductors. A data logger electrically connected to the conductors receives and records data associated with electrical charges flowing through the conductors and a computer adapted to receive, manipulate, and display the data recorded by the data logger compares beam characteristics at different locations across a high energy beam build area to provide high resolution beam information across an entire build area under representative processing conditions.

Therefore, there is a need to further improve process repeatability and part quality reproducibility for parts fabrication by an EBAM process.

SUMMARY OF THE INVENTION

In accordance with an aspect, an in situ monitoring and control device and process are disclosed herein for a High Energy Beam Additive Manufacturing (HEBAM) process, in particular an Electron Beam Additive Manufacturing (EBAM) process. The process, which may be embodied as one or more monitoring and control algorithms and executed via a host machine of the device as disclosed herein and as further described in International Publication No. WO 2018/217646 A1, published Nov. 29, 2018, the disclosure of which is hereby incorporated by reference herein, includes automatically detecting or measuring features of interest in the EBAM process using one or more sensors. Such detection or measurement may include analyzing at least one of the liquid melt zone and a processing area via a time-series feedback signal and feedback radiation; electronically imaging at least one of a solidified melted surface and the processing area via the feedback signal and feedback radiation; and analyzing chemical compositions of either one or both of the liquid melt zone and the processing area via feedback radiation. The feedback signal and feedback radiation may be captured by sensors and may be fed into a monitoring controller, which may evaluate the data associated with the detected feedback signal and feedback radiation captured by the sensors to determine any one or any combination of a magnitude, a degree, and a rate of change in monitored features of interest of any one or any combination of the EBAM process, the liquid melt zone, the solidified melted surface, and the processing area. The monitoring controller may then send process control commands to the process controller on the host machine to modify a set of process parameters for the EBAM process.

In this manner, execution of the in situ EBAM process monitoring and control algorithms may maintain consistency of the EBAM process.

In accordance with another aspect, a device may include an EBAM machine that may be configured, among other possible configurations, for an EBAM process with a Powder Bed Fusion (PBF) set-up in which electromagnetic lenses may be employed as part of a scan apparatus on the host machine. This device, including the host EBAM machine, may include a build platform, a powder deposition system, an electron beam generating apparatus, a focus apparatus, a scan apparatus, a feedback signal sensor, a feedback radiation sensor, a vacuum chamber, a monitoring controller, and a process controller. The build platform may be configured to define a processing area. The powder deposition system may deposit successive layers of a uniform powder bed onto either of the build platform and the previous powder layer. The electron beam generating apparatus may emit an electron beam. The focus apparatus may be configured to focus the electron beam onto the powder bed to sinter or fully melt the powder within one or more liquid melt zones. The scan apparatus may be configured to deflect the electron beam across the processing area. The feedback signal sensor may be configured to generate an output upon incidence of a feedback signal, e.g., a feedback electron signal, on the feedback signal sensor. The feedback radiation sensor may be configured to generate an output upon incidence of various types of feedback radiation on the feedback radiation sensor. The vacuum chamber may enclose and seal the build platform, the powder deposition system, the electron beam generating apparatus, the focus apparatus, the scan apparatus, and the feedback signal and feedback radiation sensors. The monitoring controller may interpret the data associated with the feedback signal and feedback radiation captured by the feedback signal and feedback radiation sensors and may automatically generate corresponding process control commands. The process controller may set the EBAM process parameters and may execute feedback control commands sent from the monitoring controller.

In accordance with another aspect, in situ EBAM process monitoring may be carried out based on various physical phenomena. Inside the host EBAM machine, a beam of accelerated primary electrons generated from either thermionic or field emission, may be raster-scanned on a region of interest of a powder bed over an in-process specimen in a pre-designed pattern during an electronic imaging process. Upon electron-specimen interactions, the primary electrons may scatter within the specimen and their kinetic energy may be converted into either heat or atomic molecular excitation energy. Some of the primary electrons may undergo elastic collisions with the specimen atoms and scatter back as backscattered electrons (BSE). During scattering, a portion of energy from either the primary electrons or the BSE may be transferred to the valence electrons in the conduction band of the specimen atoms via inelastic collisions. With enough energy, such energized valence electrons may escape from the atoms. If these electrons are close enough to the surface, they may successfully avoid being re-absorbed and then be emitted from the specimen surface as secondary electrons (SE). The yields of SE and BSE may be sensitive to the topographical characteristics of the specimen surface but have been found to be almost independent of the specimen temperature for metals (see, e.g., JEOL Ltd., SEM; Scanning Electron Microscope A To Z: Basic Knowledge for Using the SEM (2009); Reimer, Ludwig, Scanning Electron Microscopy: Physics of Image Formation and Microanalysis (1998)), and thus the influence of the Heat Affected Zone (HAZ) of the in-process specimen on the electron signal is minimal.

When the primary electron beam interacts with the specimen, x-rays are released by two different mechanisms: elastic interactions yield characteristic x-rays, inelastic interactions lead to the emission of continuum x-rays. When primary electrons interact elastically with the specimen atoms, ionization can occur. (See Echlin, Padrick, et al., Advanced Scanning Electron Microscopy and X-Ray Microanalysis (1986).) The inner shell vacancy is filled by the transition of an outer shell electron, and its excess energy is released as a photon. The energy of the photon is characteristic to the atom and results from the energy difference of the shells between which the electron moved. This energy is released during the filling of inner shell vacancies by excited electrons and may be used to assess the composition of the section of the specimen being irradiated. Continuum x-ray photons are released from an inelastic interaction with a specimen atom that decelerates the primary electron, and such photons may have any positive non-zero value up to total energy of the primary electron beam. FIG. 2 gives a schematic representation of the generation of SE, BSE and X-rays from electron-specimen interaction.

In electronic imaging, a grey-scale digital electronic image consists of arrays of pixels. Each pixel holds a value of pixel intensity within the grey-scale range, which represents the brightness of the pixel. A 2D digital electronic image may be generated from feedback electrons, such as but not limited to SE and BSE, emitted from the specimen surface, revealing the topographical details of the specimen. In this manner, the feedback signal, which may be but is not limited to being provided by SE and BSE, and the feedback radiation, which may include but is not limited to including X-rays, may be captured to form various time-series signals and 2D digital electronic images for the purposes of process monitoring and control. As a result, the quality control of the chemical composition of EBAM manufactured parts may be improved over existing technologies through in situ process monitoring and control via feedback signal and feedback radiation.

In accordance with another aspect, a monitoring and feedback device for use in conjunction with an electron beam generation apparatus in assessing and providing feedback associated with a processing area and a build structure formed from at least a portion of a powder bed on a substrate within the processing area using the electron beam generation apparatus may include a temperature measurement and electronic imaging device, an electromagnetic radiation detection device, and a monitoring controller. The temperature measurement and electronic imaging device may include a first plate, a second plate, and a thermal energy sensing device. The first plate may be configured to be electrically insulated from the electron beam generation apparatus and may include a feedback signal-capturing surface that may electrically conduct a first electrical signal upon impingement of impinging electrons emitted from the build structure. The first plate may extend either one or both of over and around the processing area. The second plate may be electrically insulated from the first plate. The second plate may provide an electrical noise-filtering surface confronting the first plate. The thermal energy sensing device may be electrically connected with the first plate. The thermal energy sensing device may electrically conduct a second electrical signal upon receipt of thermal radiation emitted from the build structure.

The electromagnetic radiation detection device of the monitoring and feedback device may be mounted in a housing that may provide vapor protection and thermal regulation. The electromagnetic radiation detection device may be at least partially within the vacuum chamber and may electrically conduct a third electrical signal upon the detection of electromagnetic radiation emitted from the build structure.

The monitoring controller may be configured for receiving and interpreting, by one or more processors, any one or any combination of the first electrical signal electrically conducted by the feedback signal-capturing surface, the second electrical signal electrically conducted by the thermal energy sensing device, and the third electrical signal electrically conducted by the electromagnetic radiation detection device. The first electrical signal electrically conducted by the feedback signal-capturing surface may be received and interpreted by the monitoring controller to assess the quality of the deposition of the powder bed within the processing area. The first electrical signal electrically conducted by the feedback signal-capturing surface may be received and interpreted by the monitoring controller to assess the quality of a solidified surface of the build structure after sintering or melting a portion of the powder bed within the processing area. The second electrical signal electrically conducted by the thermal energy sensing device may be received and interpreted by the monitoring controller to assess the temperature of the processing area. The third electrical signal electrically conducted by the electromagnetic radiation detection device may be received and interpreted by the monitoring controller to assess the chemical composition within the processing area.

The monitoring controller of the monitoring and feedback device may be configured for transmitting, by one or more processors, one or more instructional electrical signals corresponding to any one or any combination of first instructions, second instructions, third instructions, and fourth instructions. The first instructions may be based on the assessed quality of the deposition of the powder bed when the monitoring controller assesses the quality of the deposition of the powder bed within the processing area. The second instructions may be based on the assessed quality of the solidified surface of the build structure after sintering or melting a portion of the powder bed when the monitoring controller assesses the quality of the solidified surface of the build structure after sintering or melting a portion of the powder bed. The third instructions may be based on the assessed temperature of the powder bed within the processing area when the monitoring controller assesses the temperature of the processing area. The fourth instructions may be based on the assessed chemical composition within the processing area when the monitoring controller assesses the chemical composition within the processing area.

In some arrangements, the temperature measurement and electronic imaging device may be enclosed in a vacuum chamber or may be configured to be enclosed in a vacuum chamber.

In some arrangements, the impinging electrons may be any one or any combination of backscattered electrons and secondary electrons. In some arrangements, the monitoring controller may be configured for receiving and interpreting the first electrical signal to assess the quality of the deposition of the powder bed within the processing area using a first algorithm. In some arrangements, the monitoring controller may be configured for receiving and interpreting the first electrical signal to assess the quality of the solidified surface of the build structure after sintering or melting a portion of the powder bed within the processing area using a second algorithm. In some such arrangements, the first and the second algorithms may be the same algorithm. In some arrangements, monitoring controller may be configured for receiving and interpreting the second electrical signal to assess the temperature of the processing area using a third algorithm. In some arrangements, monitoring controller may be configured for receiving and interpreting the third electrical signal to assess the chemical composition within the processing area using a fourth algorithm.

In some arrangements, the electromagnetic radiation detection device may be an energy dispersive x-ray detection device. In such arrangements, the electromagnetic radiation may be provided by x-rays.

In some arrangements, any one or any combination of the quality of the deposition of the powder bed within the processing area, the quality of the solidified surface of the build structure after sintering or melting a portion of the powder bed within the processing area, the temperature of the powder bed within the processing area, and the chemical composition within the processing area may be assessed within various locations. Such locations may be any of the whole processing area, a user-defined area within the process-area, and a user-defined point or set of points within the processing area.

In some arrangements, any one or any combination of the quality of the deposition of the powder bed within the processing area, the quality of the solidified surface of the build structure after sintering or melting a portion of the powder bed within the processing area, the temperature of the powder bed within the processing area, and the chemical composition within the processing area may be assessed at various times. Such periods may be any one or any combination of before sintering or melting a portion of the powder bed, after sintering or melting a portion of the powder bed, and any time during sintering or melting of the powder bed.

In some arrangements, the second plate may be attached to the first plate by fasteners that may be insulated from the first and the second plates by ceramic components.

In some arrangements, each of the first and the second plates may have one or more holes that may extend through either or both of the first and the second plates. The respective holes may provide mounting points for attachment of any one or any combination of the thermal energy sensing device, the fasteners attaching the first and the second plates, and other components attachable to the holes.

In some arrangements, the thermal energy sensing device may be a thermocouple. The thermal energy sensing device may include a first electrical resistor, a second electrical resistor, a thermocouple amplifier, an instrumentation amplifier, and a suitable data logger. In some such arrangements, the first electrical resistor may be electrically connected to the first plate. The second electrical resistor may be electrically connected to the second plate. The thermocouple amplifier may be electrically connected to the thermocouple in which the thermocouple amplifier may provide a feedback electron signal corresponding to the second electrical signal. The instrumentation amplifier may be electrically connected to each of the first and the second resistors in which the instrumentation amplifier may provide a suitable signal-to-noise ratio to a feedback electron signal corresponding to the first electrical signal. The suitable data logger may be configured for sampling and suitably conditioning the first and the second electrical signals.

In some arrangements, the third electrical signal may be convertible into spectra. In some arrangements, any one or any combination of the first electrical signal, the second electrical signal, and the third electrical signal may be used to assess various process parameters. Such parameters may include a quality of the powder, a quality of the powder bed, a temperature stability of a liquid melt zone in the powder bed, topographical characteristics of the liquid melt zone, topographical characteristics of the solidified melted surface, any geometric deviation of the solidified melted surface when compared to the design, an indication of surface temperature of a topmost layer of the powder bed, the liquid melt zone, and the solidified melted surface in the processing area, and chemical composition characteristics of the powder, the powder bed, the liquid melt zone, and the solidified melted surface.

In some arrangements, the temperature measurement and electronic imaging device further may include a frame. The frame may have a base that may define a beam opening and a base opening. The beam opening may be configured for receiving the electron beam upon deflection of the electron beam. The base opening may be opposite the beam opening and may be configured to overlay the substrate.

In some arrangements, the thermal energy sensing device may be attached to the first plate. In some arrangements, the first plate may be configured to extend over the processing area in a direction non-orthogonal and nonparallel to the substrate.

In accordance with another aspect, an electron beam and powder bed processing, monitoring, and feedback device for fabricating build structure in a processing area may include an electron beam generation apparatus for generating and deflecting an electron beam over a powder bed within the processing area, a substrate, a vacuum chamber, a temperature measurement and electronic imaging device, an electromagnetic radiation detection device, a monitoring controller, and an electron beam controller. The electron beam generation apparatus may include an electron filament, a grid cup, a focus apparatus, and a scan apparatus. An electron beam may be generated from the electron filament. The grid cup may be configured for containing emitted electrons of the electron beam. The focus apparatus may be configured for focusing the electron beam. The scan apparatus may be configured for deflecting the electron beam over a powder bed within a processing area to sinter or melt at least a portion of the powder bed to form at least a portion of a build structure. The substrate may be configured for supporting the powder bed and the build structure during deflection of the electron beam.

The temperature measurement and electronic imaging device may be enclosed in the vacuum chamber and may include a first plate, a second plate, and a thermocouple. The first plate may be electrically insulated from the electron beam generation apparatus and may include a feedback signal-capturing surface. The feedback signal-capturing surface may extend either one or both over the processing area and may electrically conduct a first electrical signal upon impingement of impinging electrons emitted from the build structure. The second plate may be electrically insulated from the first plate. In this manner, the second plate may provide an electrical noise-filtering surface confronting the first plate. The thermocouple may be electrically connected with the first plate. The thermocouple may electrically conduct a second electrical signal upon receipt of thermal radiation emitted from the build structure.

The electromagnetic radiation detection device of the electron beam and powder bed processing, monitoring, and feedback device may be mounted in a housing. The housing may provide vapor protection and thermal regulation. The electromagnetic radiation detection device may be at least partially within the vacuum chamber and may electrically conduct a third electrical signal upon the detection of electromagnetic radiation emitted from the build structure.

The monitoring controller may be configured for receiving and interpreting, by one or more processors, any one or any combination of the first electrical signal electrically conducted by the feedback signal-capturing surface, the second electrical signal electrically conducted by the thermocouple, and the third electrical signal electrically conducted by the electromagnetic radiation detection device. The first electrical signal electrically conducted by the feedback signal-capturing surface may be received and interpreted by the monitoring controller using a first algorithm to assess the quality of the deposition of the powder bed within the processing area. The first electrical signal electrically conducted by the feedback signal-capturing surface may be received and interpreted by the monitoring controller using a second algorithm to assess the quality of a solidified surface of the build structure after sintering or melting a portion of the powder bed within the processing area. The second electrical signal electrically conducted by the thermocouple may be received and interpreted by the monitoring controller using a third algorithm to assess the temperature of the processing area. The third electrical signal electrically conducted by the electromagnetic radiation detection device may be received and interpreted by the monitoring controller using a fourth algorithm to assess the chemical composition within the processing area.

The monitoring controller of the electron beam and powder bed processing, monitoring, and feedback device may be configured for transmitting, by one or more processors, one or more instructional electrical signals corresponding to first instructions, second instructions, third instructions, and fourth instructions. The first instructions may be based on the assessed quality of the deposition of the powder bed when the monitoring controller assesses the quality of the deposition of the powder bed within the processing area. The second instructions may be based on the assessed quality of the solidified surface of the build structure after sintering or melting a portion of the powder bed when the monitoring controller assesses the quality of the solidified surface of the build structure after sintering or melting a portion of the powder bed. The third instructions may be based on the assessed temperature of the powder bed within the processing area when the monitoring controller assesses the temperature of the processing area. The fourth instructions may be based on the assessed chemical composition within the processing area when the monitoring controller assesses the chemical composition within the processing area.

The electron beam controller may be configured for receiving and interpreting the instructional electrical signals transmitted by the monitoring controller. The electron beam controller may be further configured for transmitting, based on the received and interpreted instructional electrical signals, any one or any combination of a grid cup electrical signal, a focus apparatus electrical signal, and a scan apparatus electrical signal. The electron beam controller may be configured to transmit, based on the received and interpreted instructional electrical signals, any one or any combination of the grid cup electrical signal to grid cup electronics associated with the grid cup to modify settings on the grid cup, the focus apparatus electrical signal to focus apparatus electronics associated with the focus apparatus to modify settings on the focus apparatus, and the scan apparatus electrical signal to scan apparatus electronics associated with the scan apparatus to modify settings on the scan apparatus. In this manner, respective settings of the grid cup, the focus apparatus, and the scan apparatus may be modified when the corresponding grip cup electrical signal, focus apparatus electrical signal, and scan apparatus electrical signal are received. Such modifications of the settings for the grip cup, the focus apparatus, and the scan apparatus reduce or eliminate determined differences between any one or any combination of the assessed quality of the deposition of the powder bed and a predefined quality of the deposition of the powder bed, the assessed quality of the solidified surface of the build structure after sintering or melting a portion of the powder bed and a predefined quality of a solidified surface of the build structure after sintering or melting a portion of the powder bed, the assessed temperature of the powder bed within the processing area and a predefined temperature of the powder bed within the processing area, and the assessed chemical composition within the processing area and a predefined chemical composition within the processing area.

In some arrangements, the combination of the monitoring controller and the electron beam controller may provide closed-loop feedback control of the electron beam generation apparatus. In some arrangements, the first plate may extend over the processing area in a direction non-orthogonal and nonparallel to the substrate.

In accordance with another aspect, a standard High Energy Beam Processing (HEBP) apparatus may be adapted by an inclusion of feedback sensors and a monitoring controller to enable in situ monitoring and feedback control of process features during use of the HEBP apparatus in a high energy beam fabrication process by the use of artifacts from the fabrication process. In this manner, feedback data associated with the fabrication process may be collected from any one or any combination of an entire processing area, a user-defined area within the processing area, and a user-defined point within the processing area. The feedback data from such locations may be collected any one or any combination of pre-melting, during melting, post-melting, and at-will. Utilizing the feedback data, various process features may be monitored and assessed. Such process features may be any one or any combination of a quality of a powder, a quality of a powder bed, a temperature stability of a liquid melt zone, topographical characteristics of the liquid melt zone, topographical characteristics of a solidified melted surface, a geometric deviation of the solidified melted surface when compared to a design, an indication of surface temperature of a topmost layer of the processing area, and chemical composition characteristics of the processing area. The indication of surface temperature of the topmost layer of the processing area may but is not limited to including any one or any combination of a temperature of the powder bed, a temperature of the liquid melt zone, and a temperature of the solidified melted surface. The chemical composition characteristics may be of any one or any combination of the powder, the powder bed, the liquid melt zone, and the solidified melted surface. The process artifacts collected may be any one or any combination of secondary electrons (SE), backscattered electrons (BSE), Auger electrons, x-rays, and thermal radiation. The adaptation of the HEBP apparatus may include additional machine elements for the collection and processing of the artifacts. The additional machine elements may include one or more detectors for the capture of all of the artifacts. In some such arrangements, the additional machine elements may include one or more systems to process the captured artifacts, to analyze the captured artifacts for monitoring purposes, and to utilize the captured artifacts in feedback control.

In accordance with another aspect, an HEBP apparatus may have in situ feedback control capability and may include a build platform, a powder deposition system, an electron beam generation system, an electron sensor system that may include one or more electron sensors, a radiation sensor system that may include one or more radiation sensors, a vacuum chamber, a monitoring controller, and a process controller. The build platform may define a processing area. The powder deposition system may be configured to provide successive layers of a uniform powder bed on the build platform. The electron beam generation system may be configured for generating and directing or otherwise providing an electron beam. The electron sensor system may be suitable for providing an output upon incidence of a feedback electron signal on any one of the electron sensors. The radiation sensor system may be suitable for providing an output upon incidence of various types of feedback radiation on any one of the radiation sensors. The vacuum chamber may house the build platform, the powder deposition system, the electron beam generation system, the electron sensor, and the radiation sensor. The monitoring controller may interpret any one or any combination of the feedback electron signal and the feedback radiation captured by the respective electron and radiation sensors and automatically generate corresponding process control commands. The process controller may be configured for setting process parameters for the HEBP apparatus and for executing the process control commands received from the monitoring controller to control the generation and directing of the electron beam by the electron beam generation system.

In some arrangements, the electron beam generation system may include a focus apparatus and a scan apparatus. In such arrangements, the focus apparatus may be configured for focusing the electron beam on the successive layers of the powder bed in order to sinter or fully melt the powder of the powder bed within a liquid melt zone or multiple liquid melt zones. In such arrangements, the scan apparatus may be configured for deflecting the electron beam across the processing area. In such arrangements, the vacuum chamber further may house either one or both of the focus apparatus and the scan apparatus. In such arrangements, the control of the generation and directing of the electron beam by the electron beam generation system may include the control of the provision of the electron beam by an electron beam generating apparatus of the electron beam generation system, control of the focus of the electron beam by the focus apparatus, and control of the deflecting of the electron beam by the scan apparatus.

In some arrangements, any the electron sensor system may include an electrically conductive sensing surface, electrical-noise filter plates, suitable ceramic components, an instrumentation amplifier, and suitable data loggers. The electrically conductive sensing surface may be configured for the capture of feedback electrons. The electrical-noise filter plates may be configured for noise reduction in the feedback electron signal. The suitable ceramic components may be configured for positioning the one or more electron sensors at a suitable location and may be configured for providing the electrical-noise filter plates with electrical insulation from the electrically conductive sensing surface. The instrumentation amplifier may be configured for providing a suitable signal-to-noise ratio in the feedback electron signal. The suitable data loggers may be configured for sampling and performing suitable signal conditioning to the feedback electron signal and process parameters for the scan apparatus process parameters. The electron sensor system may enclose the processing area to maximize the chance for capturing feedback electrons emitted from the processing area at a wide range of angles.

In some arrangements, the radiation sensor system may include one or more detectors that may have the capability of detecting electromagnetic radiation as individual photons. In some such arrangements, the radiation sensor system may include a system to measure any of energy and wavelength of the detected radiation within the process chamber.

In some arrangements, the electron sensor system may provide any one or any combination of in situ process monitoring via electronic imaging, in situ process monitoring via time-series signals, closed-loop control of the melting process, quality verification of the melting process, identification of deviations of the melting process from process specifications, and modifications of process parameters. The in situ process monitoring via electronic imaging may be used for quality verification for any one or any combination of a processing area prior to initiation of the high energy beam melting process, a powder bed prior to initiation of the melting process, and fabricated parts after the melting process. The in situ process monitoring via time-series signals may be used for quality verification of a liquid melt zone during the melting process. The closed-loop control of the melting process may be provided by detection of feedback electrons. The quality verification of the melting process may be provided by detection of the feedback electrons. The process parameters may be modified based on the identified process deviations.

In some arrangements, the radiation sensor system may provide any one or any combination of in situ process monitoring via electronic radiation detection, in situ process monitoring via electromagnetic radiation detection, and closed-loop control of an EBAM process by electromagnetic radiation detection. The in situ process monitoring via electromagnetic radiation detection may be used for chemical composition analysis. Such monitoring via electromagnetic radiation may include any one or any combination of processes to convert data from the radiation detection into process spectra, processes to analyze a composition of a powder bed in situ, and processes to analyze a composition of melted regions of a component in situ. The in situ process monitoring via electromagnetic radiation detection may be used for quality control by composition analysis and may include any one or any combination of processes to compare the process spectra with standard spectra or with other process spectra obtained by in situ measurements, and identification of differences between any one or any combination of the process spectra, layers, and melted and unmelted powder regions of the powder bed. The closed-loop control of the EBAM process may be provided by electromagnetic radiation detection and may include quantification of a chemical composition by radiation detection, identification of differences in composition between spectra obtained via in situ measurements during processing or by comparison with standard spectra, and modification of process parameters based on the identified differences in the composition.

In some arrangements, the radiation sensor system and the electron sensor system may be used in a combination. Some such combinations of radiation sensor and electron sensor systems may be used for quality assurance in which the combination may be used for indicating any one or any combination of build geometry tolerance and build chemical composition. Some such combinations of the radiation and the electron sensor systems may be used for closed-loop feedback control in which the combination may be used for process control by chemical composition analysis when the combination of the radiation sensor system and the electron sensor system are configured for indicating build chemical composition and for process control by any one or any combination of imaging of powder spreading and imaging of a build when the combination of the radiation sensor system and the electron sensor system are configured for indicating build geometry tolerance. Some such combinations of the radiation and the electron sensor systems may be used as a closed-loop feedback control system for verifying, during a high energy beam melting process, a quality of a liquid melt zone in fabricating a part and for applying corrective actions if necessary by modifying process parameters to maintain a process consistency. Some such combinations of the radiation and the electron sensor systems may be used as a closed-loop feedback control system for verifying, after the high energy beam melting process, the quality, e.g., dimensional tolerances, of the fabricated part and for applying corrective actions if necessary by modifying process parameters to maintain the process consistency.

In accordance with another aspect, a monitoring and feedback device for use in conjunction with an electron beam generation apparatus in assessing and providing feedback associated with a processing area and a build structure formed from at least a portion of a powder bed on a substrate within the processing area using the electron beam generation apparatus may include an electronic imaging device and a monitoring controller. The electronic imaging device may include a first plate configured to be electrically insulated from the electron beam generation apparatus. The first plate may include a feedback signal-capturing surface that electrically conducts an electronic imaging electrical signal upon impingement of impinging electrons emitted from the build structure. The first plate may extend either one of or both over and around the processing area. The monitoring controller may be configured for receiving and interpreting, by one or more processors, any one or any combination of the electronic imaging electrical signal electrically conducted by the feedback signal-capturing surface to assess a quality of a deposition of the powder bed within the processing area as well as to assess a quality of a solidified surface of the build structure after sintering or melting a portion of the powder bed within the processing area. The monitoring controller further may be configured for transmitting, by one or more processors, one or more instructional electrical signals corresponding to first instructions and second instructions. The first instructions may be based on an assessed quality of the deposition of the powder bed when the monitoring controller assesses the quality of the deposition of the powder bed within the processing area. The second instructions may be based on an assessed quality of the solidified surface of the build structure after sintering or melting a portion of the powder bed when the monitoring controller assesses the quality of the solidified surface of the build structure after sintering or melting a portion of the powder bed.

In some arrangements, the temperature measurement and electronic imaging device may be enclosed in a vacuum chamber or may be configured to be enclosed in a vacuum chamber.

In some arrangements, the electronic imaging device further may include a second plate electrically insulated from the first plate. The second plate may provide an electrical noise-filtering surface confronting the first plate.

In some arrangements, the first plate may be configured to extend over the processing area in a direction non-orthogonal and nonparallel to the substrate.

In some arrangements, the electronic imaging device further may include a frame and a base opening. The frame may have a base defining a beam opening for receiving the electron beam upon deflection of the beam. The base opening may be opposite the beam opening and may be configured to overlay the substrate.

In some arrangements, the electronic imaging device may be a temperature measurement and electronic imaging device that further includes a thermal energy sensing device. The thermal energy sensing device may be electrically connected with the first plate. The thermal energy sensing device may be configured for electrically conducting a thermal energy sensing electrical signal upon receipt of thermal radiation emitted from the build structure. The monitoring controller may be configured for receiving and interpreting, by one or more processors, the thermal energy sensing electrical signal electrically conducted by the thermal energy sensing device to assess the temperature of the processing area. The monitoring controller may be further configured for transmitting, by one or more processors, an instructional electrical signal corresponding to thermal energy instructions based on the assessed temperature of the powder bed within the processing area.

In some arrangements, the thermal energy sensing device may be a thermocouple. The thermocouple may include a first electrical resistor, a second electrical resistor, a thermocouple amplifier, an instrumentation amplifier, and a suitable data logger. The first electrical resistor may be electrically connected to the first plate. The second electrical resistor electrically may be connected to the second plate. The thermocouple amplifier may be electrically connected to the thermocouple. The thermocouple amplifier may provide a feedback electron signal corresponding to the thermal energy sensing electrical signal. The instrumentation amplifier may be electrically connected to each of the first and the second resistors. The instrumentation amplifier may provide a suitable signal-to-noise ratio to a feedback electron signal corresponding to the electronic imaging electrical signal. The suitable data logger may be configured for sampling and suitably conditioning the electronic imaging and the thermal energy sensing electrical signals.

In some arrangements, the monitoring and feedback device further may include an electromagnetic radiation detection device configured to be mounted in a housing providing vapor protection and thermal regulation. The electromagnetic radiation detection device may be configured for placement at least partially within a vacuum chamber and for electrically conducting a radiation detection electrical signal upon the detection of electromagnetic radiation emitted from the build structure. The monitoring controller may be configured for receiving and interpreting, by one or more processors, the radiation detection electrical signal electrically conducted by the electromagnetic radiation detection device to assess the chemical composition within the processing area. The monitoring controller may be further configured for transmitting, by one or more processors, an instructional electrical signal corresponding to detected radiation instructions based on the assessed chemical composition within the processing area.

In some arrangements, the electromagnetic radiation detection device may be an energy dispersive x-ray detection device. In such arrangements, the electromagnetic radiation may be provided by x-rays.

In some arrangements, the radiation detection electrical signal may be convertible into spectra.

In some arrangements, the electronic imaging device may be a temperature measurement and electronic imaging device that further includes a thermal energy sensing device. The thermal energy sensing device may be electrically connected with the first plate. The thermal energy sensing device may be configured for electrically conducting a thermal energy sensing electrical signal upon receipt of thermal radiation emitted from the build structure. The monitoring controller may be configured for receiving and interpreting, by one or more processors, the thermal energy sensing electrical signal electrically conducted by the thermal energy sensing device to assess the temperature of the processing area. The monitoring controller may be further configured for transmitting, by one or more processors, an instructional electrical signal corresponding to thermal energy instructions based on an assessed temperature of the powder bed within the processing area. One or some combination of the electronic imaging electrical signal, the thermal energy sensing electrical signal, and the radiation detection electrical signal may indicate a respective one or some combination of a quality of powder within the powder bed, a quality of the powder bed, a temperature stability of a liquid melt zone in the powder bed, topographical characteristics of the liquid melt zone, topographical characteristics of the solidified surface, any geometric deviation of the solidified surface when compared to a predetermined design for the build structure, a surface temperature of any one or any combination of a topmost layer of the powder bed, the liquid melt zone, and the solidified surface in the processing area, and chemical composition characteristics of any one or any combination of the powder, the powder bed, the liquid melt zone, and the solidified surface.

In some arrangements, the thermal energy sensing device may be attached to the first plate.

In some arrangements, the impinging electrons may be any one or any combination of backscattered electrons and secondary electrons.

In some arrangements, any one or any combination of the quality of the deposition of the powder bed within the processing area, the quality of the solidified surface of the build structure after sintering or melting a portion of the powder bed within the processing area, the temperature of the powder bed within the processing area, and the chemical composition within the processing area may be assessed within various locations. Such locations may be any of the whole processing area, a user-defined area within the process-area, and a user-defined point or set of points within the processing area.

In some arrangements, any one or any combination of the quality of the deposition of the powder bed within the processing area, the quality of the solidified surface of the build structure after sintering or melting a portion of the powder bed within the processing area, the temperature of the powder bed within the processing area, and the chemical composition within the processing area may be assessed at various times. Such periods may be any one or any combination of before sintering or melting a portion of the powder bed, after sintering or melting a portion of the powder bed, and any time during sintering or melting of the powder bed.

In some arrangements, the second plate may be attached to the first plate by fasteners insulated from the first and the second plates by ceramic components.

In some arrangements, each of the first and the second plates may have one or more holes that may extend through either or both of the first and the second plates. The respective holes may provide mounting points for attachment of any one or any combination of the thermal energy sensing device, the fasteners attaching the first and the second plates, and other components attachable to the holes.

In accordance with another aspect, an electron beam and powder bed processing, monitoring, and feedback device for fabricating a build structure in a processing area may include an electron beam generation apparatus, a substrate, a vacuum chamber, an electronic imaging device, a monitoring controller, and an electron beam controller. The electron beam generation apparatus may be configured for generating and deflecting an electron beam over a powder bed within the processing area. The substrate may be configured for supporting a powder bed and the build structure during deflection of the electron beam. The electronic imaging device may be enclosed in the vacuum chamber and may include a first plate electrically insulated from the electron beam generation apparatus. The first plate may include a feedback signal-capturing surface that electrically conducts a first electrical signal upon impingement of impinging electrons emitted from the build structure. The first plate may extend either one or both of over and around the processing area. The monitoring controller may be configured for receiving and interpreting, by one or more processors the first electrical signal, using a first algorithm, to assess a quality of a deposition of the powder bed within the processing area and, using a second algorithm, to assess a quality of a solidified surface of the build structure after sintering or melting a portion of the powder bed within the processing area. The monitoring controller may be further configured for transmitting, by one or more processors, one or more instructional electrical signals corresponding first instructions based on an assessed quality of the deposition of the powder bed when the monitoring controller assesses the quality of the deposition of the powder bed within the processing area and second instructions based on an assessed quality of the solidified surface of the build structure after sintering or melting a portion of the powder bed when the monitoring controller assesses the quality of the solidified surface of the build structure after sintering or melting a portion of the powder bed. The electron beam controller may be configured for receiving and interpreting the one or more instructional electrical signals transmitted by the monitoring controller. The electron beam controller further may be configured for transmitting, based on the received and interpreted instructional electrical signals, electron beam controller electrical signals to modify settings of the electron beam generation apparatus. The modified settings of the electron beam generation apparatus may reduce or eliminate determined differences between any one or any combination of (i) the assessed quality of the deposition of the powder bed and a predefined quality of the deposition of the powder bed and (ii) the assessed quality of the solidified surface of the build structure after sintering or melting a portion of the powder bed and a predefined quality of the solidified surface of the build structure after sintering or melting a portion of the powder bed.

In some arrangements, the first algorithm and the second algorithm may be the same algorithm.

In some arrangements, the electron beam generation apparatus may include an electron filament, a grid cup, a focus apparatus, and a scan apparatus. The electron beam may be generated from the electron filament. The grid cup may be configured for containing emitted electrons of the electron beam. The focus apparatus may be configured for focusing the electron beam. The scan apparatus may be configured for deflecting the electron beam over the powder bed within a processing area to sinter or melt at least a portion of the powder bed to form at least a portion of a build structure. In such arrangements, the electron beam controller may be configured for transmitting, based on the received and interpreted instructional electrical signals, any one or any combination of a grid cup electrical signal, a focus apparatus electrical signal, and a scan apparatus electrical signal. The grid cup electrical signal may be transmitted to grid cup electronics associated with the grid cup to modify settings on the grid cup. The focus apparatus electrical signal may be transmitted to focus apparatus electronics associated with the focus apparatus to modify settings on the focus apparatus. The scan apparatus electrical signal may be transmitted to scan apparatus electronics associated with the scan apparatus to modify settings on the scan apparatus. In such arrangements, the settings of the grid cup, the focus apparatus, and the scan apparatus may be modified when the corresponding grip cup electrical signal, focus apparatus electrical signal, and scan apparatus electrical signal are received to reduce or eliminate the determined differences.

In some arrangements, the electronic imaging device may include a second plate electrically insulated from the first plate. In such arrangements, the second plate may provide an electrical noise-filtering surface confronting the first plate.

In some arrangements, the electronic imaging device may be a temperature measurement and electronic imaging device. The temperature measurement and electronic imaging device further may include a thermocouple electrically connected with the first plate. The thermocouple may electrically conduct a thermal energy sensing electrical signal upon receipt of thermal radiation emitted from the build structure. The monitoring controller may be configured for receiving and interpreting, by one or more processors, using an algorithm different from the first and the second algorithms, the thermal energy sensing electrical signal electrically conducted by the thermocouple to assess a temperature of the processing area. The monitoring controller further may be configured for transmitting, by one or more processors, an instructional electrical signal corresponding to thermal energy instructions based on an assessed temperature of the powder bed within the processing area. The modified settings of the electron beam generation apparatus may reduce or eliminate determined differences between the assessed temperature of the powder bed within the processing area and a predefined temperature of the powder bed within the processing area.

In some arrangements, the electron beam and powder bed processing, monitoring, and feedback device further may include an electromagnetic radiation detection device. The electromagnetic radiation detection device may be mounted in a housing providing vapor protection and thermal regulation. The electromagnetic radiation detection device may be at least partially within the vacuum chamber and may electrically conduct a radiation detection electrical signal upon the detection of electromagnetic radiation emitted from the build structure. The monitoring controller may be configured for receiving and interpreting, by one or more processors, using an algorithm different from the first and the second algorithms, the radiation detection electrical signal electrically conducted by the electromagnetic radiation detection device to assess a chemical composition within the processing area. The monitoring controller further may be configured for transmitting, by one or more processors, an instructional electrical signal corresponding to detected radiation instructions based on an assessed chemical composition within the processing area. The modified settings of the electron beam generation apparatus may reduce or eliminate determined differences between the assessed chemical composition within the processing area and a predefined chemical composition within the processing area.

In some arrangements, the combination of the monitoring controller and the electron beam controller may provide closed-loop feedback control of the electron beam generation apparatus.

In some arrangements, the first plate may extend over the processing area in a direction non-orthogonal and nonparallel to the substrate.

In accordance with another aspect, an HEBP apparatus with in situ feedback control capability may include a build platform, a powder deposition system, an electron beam generation system, an electron sensor system, a radiation sensor system, a vacuum chamber, a monitoring controller, and a process controller. The build platform may define a processing area. The powder deposition system may be configured for providing successive layers of a uniform powder bed on the build-platform. The electron beam generation system may be configured for generating and directing an electron beam. The electron sensor system may include an electron sensor. The electron sensor system may be suitable for providing an output upon incidence of a feedback electron signal on the electron sensor. The radiation sensor system may include a radiation sensor. The radiation sensor system may be suitable for providing an output upon incidence of feedback radiation on the radiation sensor. The vacuum chamber may house the build platform, the powder deposition system, the electron beam generation system, the electron sensor, and the radiation sensor. The monitoring controller may interpret either one or both of the feedback electron signal and the feedback radiation captured by the respective electron and radiation sensors. Upon such interpretation, the monitoring controller may automatically generate corresponding process control commands. The process controller may set process parameters for the HEBP apparatus and execute the process control commands received from the monitoring controller to control the generation and directing of the electron beam by the electron beam generation system.

In some arrangements, the electron sensor system may include an electrically conductive sensing surface, electrical-noise filter plates, suitable ceramic components, an instrumentation amplifier, and suitable data loggers. The electrically conductive sensing surface may be configured for the capture of feedback electrons. The electrical-noise filter plates may be configured for noise reduction in the feedback electron signal. The suitable ceramic components may be configured for positioning the electron sensor at a suitable location and for providing the electrical-noise filter plates with electrical insulation from the electrically conductive sensing surface. The instrumentation amplifier may be configured for providing a suitable signal-to-noise ratio in the feedback electron signal. The suitable data loggers may be configured to sample and perform suitable signal conditioning to the feedback electron signal and the scan apparatus process parameters. The electron sensor system may enclose the processing area to maximize the chance for capturing feedback electrons emitted from the processing area at a wide range of angles.

In some arrangements, the radiation sensor system may include one or more detectors and a measurement system. The detectors may be configured for detecting electromagnetic radiation as individual photons. The measurement system may be configured for measuring either or both of an energy and a wavelength of the detected radiation within the process chamber.

In accordance with another aspect, an electron beam profile and location analyses system may be provided for use in conjunction with an electron beam generation apparatus in assessing and providing feedback on either one or both of a profile and a location of an electron beam emitted from the electron beam generation apparatus onto or towards a substrate. The system may include a first plate and a computer system. The first plate may be configured to be electrically insulated from the electron beam generation apparatus and may be configured to extend either one or both of over and around the substrate. The first plate may electrically conduct a feedback electron signal, upon impingement of impinging electrons deflected or emitted from the substrate onto the first plate. The computer system may be configured for receiving the feedback electron signal from the first plate and for interpreting the feedback electron signal for the assessment of the one or both of the profile and the location, relative to the substrate, of the emitted electron beam when the first plate is extended the one or both of over and around the substrate at a predetermined position and in a predetermined orientation relative to the substrate.

In some arrangements, the system may be an in-process electron beam profile and location analyses system. In some arrangements, the computer system may include but is not limited to including either or both of a monitoring controller and a process controller.

In some arrangements, the system further may include a first filtering plate that may be electrically insulated from the first plate. In such arrangements, the first filtering plate may provide an electrical noise-filtering surface confronting the first plate.

In some arrangements, the system further may include fasteners and ceramic components. In such arrangements, the combination of the fasteners and the ceramic components may attach the first filtering plate to the first plate. In such arrangements, the first plate and the first filtering plate may be insulated from the fasteners by the ceramic components.

In some arrangements, the first plate may be configured to extend over the substrate in a direction non-orthogonal and nonparallel to a plane defined by the substrate. In some arrangements, the system further may include a frame having a base. The base may define a beam opening for receiving the electron beam and a base opening opposite the beam opening and configured to overlay the substrate. In such arrangements, the frame may be attached to the first plate.

In some arrangements, the system further may include a second plate that may be configured to be electrically insulated from the electron beam generation apparatus. In such arrangements, the second plate may be configured to extend either one or both of over and around the substrate. The second plate may be attached to the frame on a side of the frame opposite the first plate.

In some arrangements, the impinging electrons may be any one or any combination of backscattered electrons and secondary electrons.

In some arrangements, the system further may include the substrate. In some arrangements, the substrate may include fiducial markers located on the substrate such that the impinging electrons impinge on the fiducial markers when the substrate is at the predetermined position and in the predetermined orientation.

In some arrangements, the substrate may be a plate. The plate may include any one or any combination of bosses, recesses, holes, and slots defining a preset pattern. In such arrangements, the respective one or combination of the bosses, recesses, holes, and slots may be located on the plate such that the emitted electron beam impinges on the respective one or combination of bosses, recesses, holes, and slots when the plate is at the predetermined position and in the predetermined orientation. In some such arrangements, the holes may be through holes or more preferably blind holes. In some arrangements, the substrate may be engraved with the preset pattern.

In some arrangements when the plate includes bosses, the bosses may be limited to a thickness less than a first layer of powder material deposited onto the substrate. In some arrangements, the recesses may include one or both of blind holes and elongated grooves when the plate includes the recesses. In some arrangements, the slots may be slits extending generally linearly along the substrate when the plate includes the slots. In some such arrangements, the slits may extend in any one or any combination of a first direction, a second direction perpendicular to the first direction, and a third direction transverse to the first direction and the second direction. In such arrangements, the third direction is preferably at a 45 degree angle to the first direction and the second direction. In some arrangements, the slots may be recesses that do not extend through the substrate.

In some arrangements, the computer system may provide visual data for the assessment of or assesses the location of the emitted electron beam. In some such arrangements, the substrate may include preset location holes within the plate when the substrate includes one or both of the recesses and the holes such that the feedback electron signal may provide location data corresponding to an approximately real-time location of the emitted electron beam. In some such arrangements, the location holes are at known distances from each other or at known distances from one or more data. In some such arrangements, each of the location holes may be spaced apart equally from the location holes adjacent to each of the location holes.

In some arrangements, the diameter of the emitted electron beam may be greater than a cross-section of the preset pattern. In some arrangements, a diameter of the emitted electron beam may be approximately the same as a diameter of the location holes. In some arrangements, a diameter of the emitted electron beam may be greater than a width across the slots when the plate includes slots.

In some arrangements, the computer system may store, in a tangible non-transient computer-storage medium of the computer system, scanning speed data corresponding to a scanning speed of the electron beam over a given time interval. In such arrangements, the computer system may provide visual data for the assessment of or may assess the one or both of the profile and the location of the emitted electron beam by applying an algorithm using feedback electron data determined from the feedback electron signal and the scanning speed data. In such arrangements, the feedback electron data may correspond to voltages formed by the impinging electrons over the given time interval in which the time interval may be a length of time the feedback electron signal is below a reference value. In some such arrangements, a majority of the feedback electron signal may be below the reference value when the emitted electron beam is directed at the respective one or combination of the bosses, the recesses, the holes, and the slots through the substrate.

In some arrangements, the reference value may be a preset value. In some other arrangements, the reference value may be an average value of the feedback electron signal along a portion or portions of a top surface of the substrate. In some arrangements, the average value of the feedback electron signal may be determined by ignoring any noise in the feedback electron signal.

In some arrangements, the computer system may store, in a tangible non-transient computer-storage medium of the computer system, scanning speed data corresponding to a scanning speed of the electron beam. In such arrangements, the computer system may assess the one or both of the profile and the location of the emitted electron beam by applying an algorithm using feedback electron data determined from the feedback electron signal and the scanning speed data. In some such arrangements, the computer system may store, in a tangible non-transient computer-storage medium of the computer system, pattern reference data corresponding to the preset pattern such that the computer system may assess the one or both of the profile and the location of the emitted electron beam by applying the algorithm further using the pattern reference data.

In some arrangements, the computer system may include a monitoring controller. In such arrangements, the monitoring controller may be configured to manipulate the feedback electron signal for the assessment of the one or both of the profile and the location of the emitted electron beam.

In some arrangements, the computer system may include a process controller. The process controller may be configured for directing the electron beam generation apparatus to emit the electron beam such that the electron beam travels across the substrate at the scanning speed. In such arrangements, the scanning speed may be variable or more preferably constant or substantially constant as directed by the process controller. In some arrangements in which the computer system includes the monitoring controller, the monitoring controller may be configured for receiving and interpreting the feedback electron signal to assess the scanning speed of the electron beam.

In some arrangements, the substrate may be configured to support powder material and at least one object fabricated from the powder material using the electron beam generation apparatus during an additive manufacturing process.

In some arrangements, the computer system may provide the visual data for the assessment of or assesses the one or both of the profile and the location of the emitted electron beam by applying an algorithm using feedback electron data determined from the feedback electron signal and scanning speed data corresponding to the scanning speed of the electron beam. In some such arrangements, the scanning speed data may correspond to one or more scan speeds over a given time interval and the feedback electron data may correspond to voltages formed by the impinging electrons over the given time interval. In some such arrangements, the time interval may be a length of time the feedback electron signal is below a reference value.

In some arrangements, the algorithm may include the multiplication of an average of the one or more scan speeds over the given time interval by the time interval for the assessment of at least a portion of the profile of the emitted electron beam.

In some arrangements, the profile may include any one or any combination of a beam size, a beam shape, a beam astigmatism condition, and a beam focus condition.

In accordance with another aspect, an electron beam system for fabricating a build structure in a processing area may include an electron beam generation apparatus, a substrate, a vacuum chamber, an electronic imaging device, and a computer system. The electron beam generation apparatus may be configured for generating and deflecting an electron beam over a powder bed within the processing area. The substrate may be configured for supporting the powder bed and the build structure during deflection of the electron beam. The electronic imaging device may be enclosed in the vacuum chamber. The electronic imaging device may include a first plate electrically insulated from the electron beam generation apparatus and having a feedback signal-capturing surface that electrically conducts a feedback electron signal upon impingement of impinging electrons emitted from the processing area.

The first plate may extend either one or both of over and around the processing area. The computer system may be configured for receiving the feedback electron signal from the first plate and interpreting the feedback electron signal for the assessment of one or both of the profile and the location, relative to the substrate, of the deflected electron beam when the first plate is extended the one or both of over and around the substrate at a predetermined position and in a predetermined orientation relative to the substrate.

In some arrangements, the electronic imaging device may include a feedback signal-capturing surface that may electrically conduct the feedback electron signal.

In some arrangements, the system further may include a monitoring controller and may include an electron beam controller. The monitoring controller may be configured for receiving and interpreting, by one or more processors, the feedback electron signal using a first algorithm to assess a quality of a deposition of the powder bed within the processing area. The monitoring controller may be configured for receiving and interpreting, by one or more processors, the feedback electron signal using a second algorithm to assess a quality of a solidified surface of the build structure after sintering or melting a portion of the powder bed within the processing area. The monitoring controller may be further configured for transmitting, by one or more processors, one or more instructional electrical signals. Such instructional electrical signals may correspond to either or both of first instructions and second instructions. The first instructions may be based on an assessed quality of the deposition of the powder bed when the monitoring controller assesses the quality of the deposition of the powder bed within the processing area. The second instructions may be based on an assessed quality of a solidified surface of the build structure after sintering or melting a portion of the powder bed when the monitoring controller assesses the quality of the solidified surface of the build structure after sintering or melting a portion of the powder bed. The electron beam controller may be configured for receiving and interpreting the one or more instructional electrical signals transmitted by the monitoring controller. The electron beam controller may be further configured for transmitting, based on the received and interpreted instructional electrical signals, electron beam controller electrical signals to modify settings of the electron beam generation apparatus. The modified settings of the electron beam generation apparatus may reduce or eliminate determined differences between the assessed quality of the deposition of the powder bed and a predefined quality of a deposition of the powder bed. Additionally or separately, the modified settings of the electron beam generation apparatus may reduce or eliminate determined differences between the assessed quality of the solidified surface of the build structure after sintering or melting a portion of the powder bed and a predefined quality of a solidified surface of the build structure after sintering or melting a portion of the powder bed.

In some arrangements, the electron beam generation apparatus may include an electron filament, a grid cup, a focus apparatus, and a scan apparatus. The electron filament may be configured to generate an electron beam. The grid cup may be configured for containing emitted electrons of the electron beam. The focus apparatus may be configured for focusing the electron beam. The scan apparatus may be configured for deflecting the electron beam over the powder bed within a processing area to sinter or melt at least a portion of the powder bed to form at least a portion of the build structure. In some such arrangements, the electron beam controller may be configured for transmitting, based on the received and interpreted instructional electrical signals, any one or any combination of a grid cup electrical signal, a focus apparatus electrical signal, and a scan apparatus electrical signal. The grid cup electrical signal may be transmitted to grid cup electronics associated with the grid cup to modify settings on the grid cup. The focus apparatus electrical signal may be transmitted to focus apparatus electronics associated with the focus apparatus to modify settings on the focus apparatus. The scan apparatus electrical signal may be transmitted to scan apparatus electronics associated with the scan apparatus to modify settings on the scan apparatus. In this manner, the settings of the grid cup, the focus apparatus, and the scan apparatus may be modified when the corresponding grip cup electrical signal, focus apparatus electrical signal, and scan apparatus electrical signal are received to reduce or eliminate the determined differences.

In some arrangements, the system further may include a first filtering plate electrically insulated from the first plate. The first filtering plate may provide an electrical noise-filtering surface confronting the first plate.

In some arrangements, the electronic imaging device may be a temperature measurement and electronic imaging device. In such arrangements, the electronic imaging device further may include a thermocouple electrically connected with the first plate. The thermocouple may electrically conduct a thermal energy sensing electrical signal upon receipt of thermal radiation emitted from the build structure. In some such arrangements, the monitoring controller may be configured for receiving and interpreting, by one or more processors, using an algorithm different from the first and the second algorithms, the thermal energy sensing electrical signal electrically conducted by the thermocouple to assess a temperature of the processing area. In some such arrangements, the monitoring controller further may be configured for transmitting, by one or more processors, an instructional electrical signal corresponding to thermal energy instructions based on an assessed temperature of the powder bed within the processing area. In this manner, the modified settings of the electron beam generation apparatus may reduce or eliminate determined differences between the assessed temperature of the powder bed within the processing area and a predefined temperature of the powder bed within the processing area.

In some arrangements, the system further may include an electromagnetic radiation detection device mounted in a housing providing vapor protection and thermal regulation. The electromagnetic radiation detection device may be at least partially within the vacuum chamber and may electrically conduct a radiation detection electrical signal upon the detection of electromagnetic radiation emitted from the build structure. In some such arrangements, the monitoring controller may be configured for receiving and interpreting, by one or more processors, using an algorithm different from the first and the second algorithms, the radiation detection electrical signal electrically conducted by the electromagnetic radiation detection device to assess a chemical composition within the processing area. In some such arrangements, the monitoring controller further may be configured for transmitting, by one or more processors, an instructional electrical signal corresponding to detected radiation instructions based on an assessed chemical composition within the processing area. In this manner, the modified settings of the electron beam generation apparatus may reduce or eliminate determined differences between the assessed chemical composition within the processing area and a predefined chemical composition within the processing area.

In some arrangements, the first plate may extend over the processing area in a direction non-orthogonal and nonparallel to the substrate.

In accordance with another aspect, an electron beam profile and location analyses system may be provided for use in conjunction with an electron beam generation apparatus in assessing and providing feedback on one or both of a profile and a location of an electron beam emitted from the electron beam generation apparatus. The system may include a substrate on which the emitted electron beam generation apparatus impinges and a first plate. The first plate may be configured to be electrically insulated from the electron beam generation apparatus and may be configured to extend one or both of over and around the substrate. The first plate may electrically conduct a feedback electron signal upon impingement of impinging electrons deflected or emitted from the substrate onto the first plate.

In some arrangements, the system may be an in-process electron beam profile and location analyses system. In some arrangements, the system further may include a first filtering plate electrically insulated from the first plate. In such arrangements, the first filtering plate may provide an electrical noise-filtering surface confronting the first plate. In some arrangements, the system further may include fasteners and ceramic components. In such arrangements, the combination of the fasteners and the ceramic components may attach the first filtering plate to the first plate. The first plate and the first filtering plate may be insulated from the fasteners by the ceramic components.

In some arrangements, the first plate may be configured to extend over the substrate in a direction non-orthogonal and nonparallel to a plane defined by the substrate. In some arrangements, the system further may include a frame having a base that may define a beam opening and a base opening opposite the beam opening. The beam opening may be configured for receiving the electron beam. The base opening may be configured to overlay the substrate. In some such arrangements, the frame may be attached to the first plate.

In some arrangements, the system further may include a second plate that may be configured to be electrically insulated from the electron beam generation apparatus. In some such arrangements, the second plate may be configured to extend one or both of over and around the substrate. In some such arrangements, the second plate may be attached to the frame on a side of the frame opposite the first plate.

In some arrangements, the impinging electrons may be any one or any combination of backscattered electrons and secondary electrons.

In some arrangements, the substrate may include fiducial markers located on the substrate such that the feedback electron signal impinges on the fiducial markers when the substrate is at the predetermined position and in the predetermined orientation.

In some arrangements, the substrate may be a plate. The plate may include any one or any combination of bosses, recesses, holes, and slots defining a preset pattern. In some such arrangements, the respective one or combination of the bosses, recesses, holes, and slots may be located on the plate such that the emitted electron beam impinges on the respective one or combination of bosses, recesses, holes, and slots when the plate is at the predetermined position and in the predetermined orientation. In some arrangements, the substrate may be engraved with the preset pattern.

In some arrangements when the plate includes bosses, the bosses may be limited to a thickness less than a first layer of powder material deposited onto the substrate. In some arrangements, the recesses may include either one or both of blind holes and elongated grooves when the plate includes the recesses. In some arrangements, the slots may be slits extending generally linearly along the substrate when the plate includes the slots. In some such arrangements, the slits may extend in any one or any combination of a first direction, a second direction perpendicular to the first direction, and a third direction transverse to the first direction and the second direction. In such arrangements, the third direction is preferably at a 45 degree angle to the first direction and the second direction.

In some arrangements, the substrate may be configured to support powder material and at least one object fabricated from the powder material using the electron beam generation apparatus during an additive manufacturing process.

In accordance with another aspect, a process for fabricating a build structure is provided. In this process, electrons deflected or emitted from a substrate impinge on a surface of a sensor as a result of an electron beam impinging on the substrate. In the process, one or both of a profile of the electron beam and a location of the electron beam relative to the substrate are determined based on a feedback electron signal formed by and corresponding to the impingement of the electrons on the surface of the sensor. In the process, the build structure is fabricated on the substrate.

In some arrangements of the process, a powder layer is deposited on the substrate. The electron beam is emitted onto the deposited powder, after determining the one or both of the profile and the location of the electron beam, to form at least one layer of the build structure. Additional powder layers are deposited on previously deposited powder layers. The electron beam is emitted onto each additional powder layer, before adding further powder layers, to form additional layers of the build structure to be fabricated. In some arrangements, the powder may be a metallic powder, a ceramic powder, or a combination of metallic and ceramic powders.

In some arrangements of the process, parameters of the electron beam may be adjusted, based on the determined one or both of the profile and location of the electron beam, before emitting the electron beam onto the deposited powder. In some such arrangements, a computer processor may determine the one or both of the profile and the location of the electron beam. In some such arrangements, the adjustments of the parameters of the electron beam are performed by a digital controller. In such arrangements, the digital controller may be a microcontroller. In some arrangements, the determining of the profile of the electron beam is further based on a scan speed of the electron beam when the profile of the electron beam is determined.

BRIEF DESCRIPTION OF THE DRAWINGS

A more complete appreciation of the subject matter of the present invention and various advantages thereof may be realized by reference to the following detailed description, in which reference is made to the following accompanying drawings, in which.

DETAILED DESCRIPTION

Figure 1:
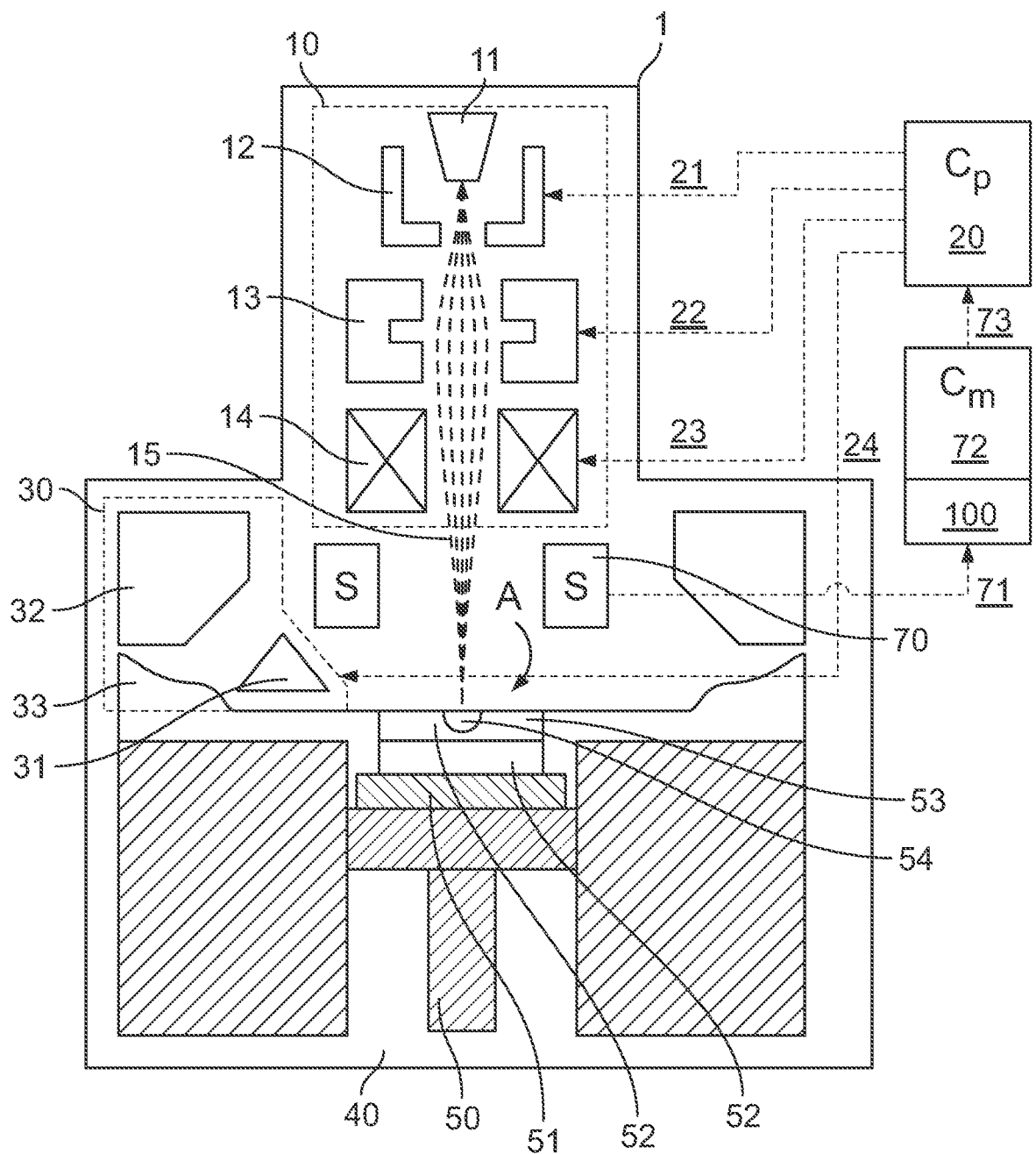
FIG. 1 is a schematic illustration of an Electron Beam Additive Manufacturing (EBAM) apparatus.

Referring to the drawings, as shown in FIG. 1, additive manufacturing device 1 is configured for use as a host machine in an Electron Beam Additive Manufacturing (EBAM) process which includes a Powder Bed Fusion (PBF) set-up and employs electromagnetic lenses as part of its scan apparatus. The EBAM apparatus may, however, be embodied in many different forms and should not be construed as being limited to the embodiments set forth herein. An example of an EBAM process which includes a PBF set-up and employs electromagnetic lenses as part of its scan apparatus to which the present invention could be applied is described in European Publication No. 2918396 A1, the disclosure of which is hereby incorporated by reference herein. As will be understood by those of ordinary skill in the art, an EBAM process with PBF set-up allows a complex objects, such as medical components with porous structures, to be formed in a progressive or layered manner using an electron beam.

Host machine 1 includes electron gun 10 contained in vacuum chamber 40 which maintains a substantially vacuum environment. In the example shown, gun 10 includes electron filament 11, grid cup 12, focus apparatus 13 and scan apparatus 14. While part of gun 10 may be positioned outside chamber 40 for access and electrical connectivity, as in the example shown, gun 10 is configured for generating and transmitting primary electron beam 15 within the vacuum environment, as well as for directing beam 15 towards powder bed 53. As further shown in FIG. 1, powder bed 53 and fused layers 52 on substrate 51, which is positioned on build platform 50. Build platform 50 moves downward upon the completion of one layer to allow a successive power bed layer to be deposited onto the newly completed layer by powder deposition system 30.

Primary electron beam 15 is generated from electron filament 11 by means such as thermionic or field emission and accelerated toward powder bed 53 by an accelerated voltage, as will be understood by those with ordinary skill in the art. The kinetic energy of primary electron beam 15 is converted into heat upon interaction between beam 15 and powder bed 53. The heat generated by beam 15 is used to melt selective regions within EBAM processing area A. The amount of electrons emitted from electron filament 11 is controlled by grid cup 12. After passing through grid cup 12, the electrons then successively pass through focus apparatus 13 to form a focused primary beam 15 and are deflected via an electromagnetic lens to various locations on the powder bed 53 by scan apparatus 14. Host machine process controller 20, which controls the powder deposition and scanning process of host machine 1, sets the energy of the emitted electrons from electron filament 11 and enables grid cup 12 to contain the emitted electrons. In addition, host machine process controller 20 controls the operation of both focus apparatus 13 and scan apparatus 14.

A three-dimensional (3D) object is formed by progressively forming and cooling a liquid melt zone 54 into fused layers 52 on substrate 51. Liquid melt pool 54 is formed by beam-melting of electrically conductive powder 33, e.g., suitable powder such as but not limited to titanium or titanium alloys. Powder deposition system 30 includes powder container 32 which stores powder 33 and powder feeder 31 which uniformly deposits the powder, e.g., with a rake or a roller or other suitable powder delivery mechanisms having a controlled speed, on top of substrate 51 for the first layer 52 and then onto previous layers 52 for successive powder depositions. In this example, powder feeder 31 obtains powder 33 from powder containers 32 on opposite sides of substrate 51. While not shown in FIG. 1 for simplicity, vacuum chamber 40 may be evacuated using a vacuum subsystem, e.g., turbo-molecular pump, ducts, valves etc., as understood by those skilled in the art. Sintering or full melting of electronically conductive powder 33 may be carried out based on a set of design data, e.g., computer-aided design (CAD) data or other 3D design files, imported to host machine process controller 20. In some arrangements, the 3D design data is divided into a set of successive 2D cross sections, i.e., slices, by host machine process controller 20 to create design data usable for the fabrication process. According to the information contained in the design data useable for the fabrication process, host machine process controller 20 commands primary electron beam 15 to sinter or fully melt selective regions on powder bed 53 by setting suitable process parameters on electron gun 10.

Still referring to FIG. 1, to achieve an in situ process monitoring and control system for the EBAM process, host machine process controller 20 may be electrically connected to one or multiple sensors 70, as in the example shown, to detect and measure one or more specific process features of interest of powder bed 53 and liquid melt zone 54. The information received by sensors 70 corresponding to the process features of interest is relayed to monitoring controller 72, which is connected to host machine process controller 20 as a set of sensor data 71. Monitoring controller 72 receives sensor data 71 and performs one or more algorithms, represented collectively as algorithm 100 in FIGS. 1 and 4, to interpret the sensor data relative to user-defined parameters. Such parameters may be or may correspond to any of a quality of deposited powder 33, a quality of powder bed 53, a temperature stability of liquid melt zone 54, topographical characteristics of liquid melt zone 54, topographical characteristics of a solidified melted surface 65 (see FIG. 2), dimensional parameters for assessing any geometric deviations of solidified melted surface 65, a temperature of powder bed 53, a temperature of liquid melt zone 54, a temperature of solidified melted surface 65, a chemical composition of powder 33, a chemical composition of powder bed 53, a chemical composition of liquid melt zone 54, and a chemical composition of solidified melted surface 65. Monitoring controller 72 transmits an electrical signal to host machine process controller 20 to modify final process parameters 21-24 for the EBAM process as needed. For example, monitoring controller 72 may transmit an electrical signal host machine process controller 20 to either of or both of alter the powder deposition rate of powder feeder 31 and electron beam properties by modifying the settings of electron gun 10.

Monitoring controller 72 may be configured to operate as an integrating system which consists of components responsible for process data collection and process data analysis. For process data collection, high-speed data acquisition boards may be used for real-time acquisition of large volumes of process data associated with the high-speed time-series feedback signal and feedback radiation as well as the digital electronic images generated from electronic imaging. For process data analysis, a desktop computer may be used to operate tailored software for interpreting the feedback signal and feedback radiation, interpreting the digital electronic image generation, and also sending corresponding process control commands to host machine process controller 20 of EBAM host machine 1. Monitoring controller 72 may include sufficient read only memory (ROM), random access memory (RAM), electronically-erasable programmable read only memory (EEPROM), etc., of a size and speed sufficient for executing algorithm 100 as set forth below. Monitoring controller 72 may also be configured or equipped with other required computer hardware, such as a high-speed clock, requisite Analogue-to-Digital (A/D) and Digital-to-Analogue (D/A) circuitries, any necessary input or output circuitries and devices (I/O), as well as appropriate electrical signal conditioning and/or buffer circuitry. Any algorithms resident in EBAM host machine 1 or accessible thereby, including algorithm 100, as described below, may be stored in memory and automatically executed to provide the respective functionality.

In the example shown in FIG. 1, algorithm 100, which may be embodied as a single algorithm or multiple algorithms, is automatically executed by monitoring controller 72 to interpret sensor data 71 and by host machine process controller 20 on host machine 1 to modify process parameters during the EBAM process. Interpretation of sensor data 71 by monitoring controller 72 identifies an appropriate action to be taken and determines any input parameters, transmitted as the set of input parameters 73 from monitoring controller 72 to host machine process controller 20, requiring modification in order to maintain consistency, and in some arrangements accuracy within predetermined limits within the EBAM process. A closed-loop process feedback control is formed between monitoring controller 72, working with host machine process controller 20, and EBAM host machine system components, e.g., gun 10, powder deposition system 30, etc., to allow for a real-time modification to the final control parameters 21-24.

The process features of interest to be monitored across the processing area, as indicated by arrow A in FIG. 1, during the EBAM process are linked to various sensors 70. In one embodiment, multiple sensors 70 may be integrated into EBAM host machine 1 and operated independently or in combination with each other depending on the particular application. Sensors 70 may include, by way of example, an electronic imaging device equipped with an electronically conductive surface or surfaces for capturing the feedback electron signal, which may be but is not limited to being provided by SE and BSE, and feedback thermal radiation emanating from an in-process part being fabricated and convert them into digital electronic images from BSE and SE for in situ process monitoring purposes. Sensors 70 may also include a feedback radiation device, which may be but is not limited to being configured for receiving and detecting X-rays, to enable process control by chemical composition analysis.

Figure 3:
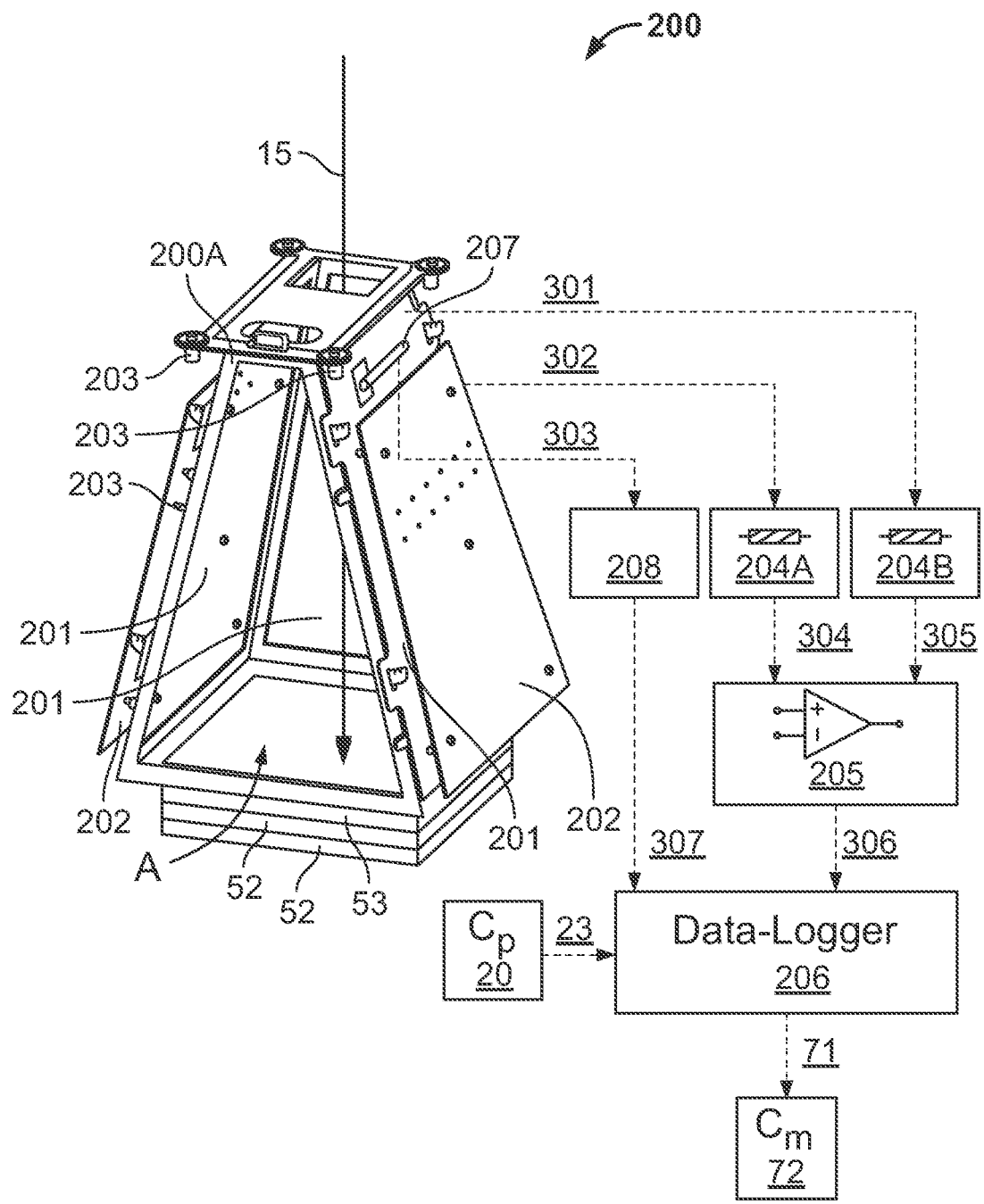
FIG. 3 is a schematic illustration of a feedback electron and thermal radiation collection system.

As further shown in FIG. 1, in some arrangements, at least one of sensors 70 may be mounted inside vacuum chamber 40. As shown in FIG. 3, in some such arrangements, sensors 70 may be in the form of device 200, which as in the example shown may act as a temperature measurement and electronic imaging device to monitor processing area A. In the example of FIG. 3, device 200 is configured and installed in EBAM host machine 1 to be electrically insulated from the rest of the host machine by the use of suitable ceramic components 203 due to their suitable electrical and thermal insulation ability. The temperature measurement and electronic imaging device may take many possible forms of design. In the example shown in FIG. 3, temperature measurement and electronic imaging device 200 captures the feedback thermal radiation signal from the topmost surface of processing area A via a suitable type of thermocouple 207 attached to feedback signal-capturing surface 201 of device 200. The EBAM process is carried out in a vacuum environment within vacuum chamber 40 of host machine 1. The heat generated from the interaction between primary electron beam 15 and processing area A is transferred to device 200 through thermal radiation and convection. As a result, measurement of the heat transferred to device 200 in the form of temperature gives an indication of temperature of the topmost surface of processing area A. The feedback thermal signal captured by thermocouple 207, in the form of electrical voltage 303, may be transmitted from the inside of vacuum chamber 40 to a location external to the vacuum through the use of vacuum feed-through, as will be understood by those of ordinary skill in the art. There may be many possible embodiments for electrical signal conditioning. Referring to FIG. 3, in one of the possible embodiments, measured thermocouple voltage 303 is amplified by an appropriate thermocouple amplifier 208. Thermocouple amplifier output voltage 307 may be sampled by data logger 206. Data logger 206 output voltage, in the form of sensor data 71, can then be processed by monitoring controller 72 for in situ temperature analysis of the topmost surface of processing area A.

Figure 2:
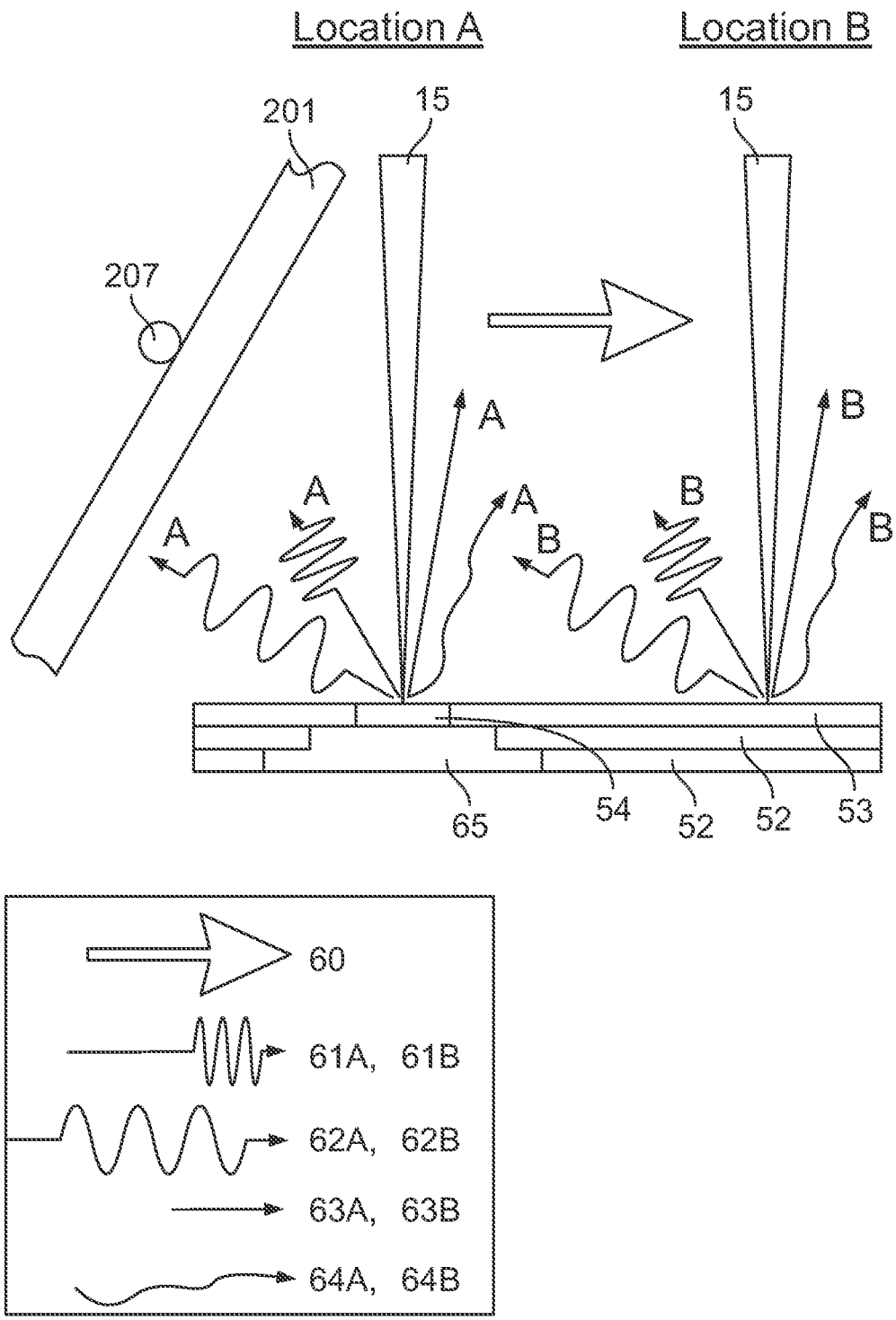
FIG. 2 is a schematic illustration of a primary electron beam/processing area interaction.

Referring now to FIGS. 2 and 3, device 200 in the example shown also captures the feedback electron signal generated from electron-specimen interaction and provided by feedback electrons, such as but not limited to secondary electrons (SE) and backscattered electrons (BSE), which are received via frame 200A of device 200 and feedback signal-capturing surface 201 of a conductive plate of device 200 that is attached to the frame. Frame 200A and feedback signal-capturing surface 201 are made of an electrically conductive material, which preferably may be stainless steel, mild steel, silver, copper, titanium, nickel, or a combination thereof. In other arrangements, the signal-capturing surface could be made of other materials. Surface 201, as in the example shown in FIG. 3, is electrically connected to frame 200A and may be configured and positioned within EBAM host machine 1 to enclose the entirety of processing area A. As in the example shown, frame 200A may include inclined supports such that the attached conductive plate and thus feedback signal-capturing surface 201 extends in a parallel direction to the supports. In this manner, the chances of capturing the feedback signal emitted from either of an in-process part being fabricated and the processing area surface, even when the signal travels at various angles with respect to substrate 51, is enhanced.

The captured feedback electron signal, in the form of electrical current 301, may be transmitted from the inside of vacuum chamber 40 to a location external to the vacuum through the use of vacuum feed-through, as will be understood by those of ordinary skill in the art. There may be many possible embodiments for electrical signal conditioning. Referring to FIG. 3, in one possible embodiment, signal current 301 may be converted to a corresponding electrical voltage by passing the current through electrical resistor 204B having a predefined resistance. EBAM host machine 1, with reference to the example shown in FIG. 1, creates a certain level of electrical noise throughout the EBAM process. In some embodiments, noise-filtering plates, such as noise-filtering plates 202, may also be installed to help provide a suitable signal-to-noise Ratio (SNR) for further processing. Still referring to FIG. 3, as in the example shown, noise-filtering plates 202 may be mounted onto corresponding feedback signal-capturing surfaces 201 with the use of suitable ceramic components 203 for electrical insulation. Similar to the treatment of signal current 301, noise current 302 may be converted to a corresponding electrical voltage by passing the current through electrical resistor 204A having a predefined resistance. Any electrical noise present during the EBAM process may be experienced by both the feedback signal-capturing surfaces 201 and the corresponding noise-filtering plates 202. Therefore, both signal voltage 305 and noise voltage 304 may be fed to instrumentation amplifier 205 in order to amplify the difference between the two voltages to a suitable level and generate instrumentation amplifier output voltage 306, which is an amplified feedback signal with the electrical noise removed, i.e., feedback signal with a suitable SNR.

Referring to FIGS. 1-3, in electronic imaging of either of an in-process part being fabricated and the processing area surface, electron beam scan apparatus control parameter 23, in the form of electrical voltage, generated by host machine process controller 20 is also required for digital electronic image generation, as understood by those of ordinary skill in the art. Instrumentation amplifier output voltage 306, carrying topographical details of the area which primary electron beam 15 encountered, is used to define pixel intensities in a digital electronic image while scan apparatus control parameter 23 is used to allocate the pixel intensities to the corresponding pixels in the image.

As depicted schematically in FIG. 2, when primary electron beam 15 interacts with regions in processing area A with different topography, different strengths of feedback electron signals and feedback radiation signals are generated. When primary electron beam 15 moves in the direction 60 from location A to location B as demonstrated in FIG. 2, the beam moves from interacting with liquid melt zone 54 and/or solidified melted surface 65 to powder bed 53. Due to differences in topography between the two regions, feedback electron signal with strength A (SE 64A and BSE 63A), feedback thermal radiation with strength A (62A) and feedback X-rays with strength A (61A) are generated from location A while feedback electron signal with strength B (SE 64B and BSE 63B), feedback thermal radiation with strength B (62B) and feedback X-rays with strength B (61B) are generated from location B. The strength difference between the feedback electron signals leads to different signal levels of the output voltage 306 and thus results in differences in pixel intensity in the digital electronic image. With regard to data acquisition, data logger 206 with a suitable data acquisition speed may be used to sample both instrumentation amplifier output voltage 306 and scan apparatus control parameter 23 and perform analog-to-digital conversion (ADC) on the signals. The data logger output voltage, in the form of sensor data 71, may then be processed by monitoring controller 72 for digital electronic image generation. The topographical details in a digital electronic image are minimally affected by electrical noise coming from the Heat Affected Zone (HAZ) when compared to optical images generated from radiation with wavelength either in the visible or infrared region as their source of illumination. As a result, the digital electronic image generated gives higher spatial resolution around the EBM-manufactured part boundaries. Moreover, electronic imaging provides flexibility in scanning different regions of interest and allowing various image magnifications to be defined without compromising the spatial resolution of the digital electronic image.

EBAM Process Monitoring and Feedback Control

Figure 4:
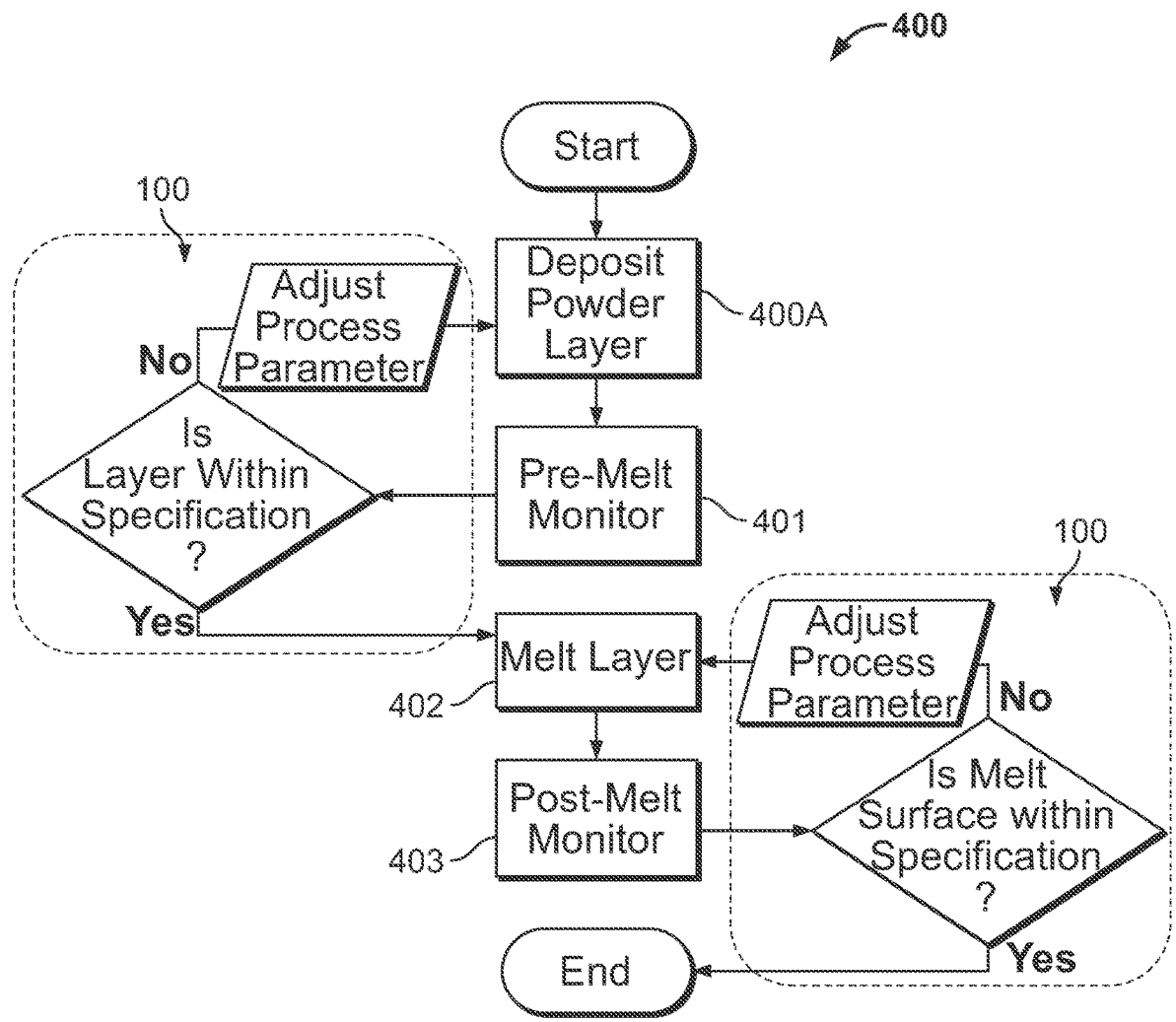
FIG. 4 is a high-level process flow diagram of an in situ EBAM monitoring and control process.

Referring to both FIGS. 1 and 4, the high level process flow diagram demonstrates an in situ EBAM process monitoring and feedback control process 400 using electronic imaging for processing area quality verification and part-geometry analysis. In particular, FIG. 4 depicts an EBAM process on one particular layer. An EBAM host machine which includes a PBF set-up and employs electromagnetic lenses as part of its scan apparatus, such as EBAM host machine 1, is considered relative to the discussion of the process shown in FIG. 4. During the EBAM process, in step 400A, EBAM host machine 1 prepares the powder bed layer for the EBAM process. In subsequent step 401, pre-melt monitoring via electronic imaging of processing area A is optionally carried out to verify the quality of the powder deposition based on the feedback electron signal received by feedback signal-capturing surface 201. During this step, pre-melt electronic imaging may be used to quantify processing area abnormality, such as detached metallization formed from vaporized metal and non-uniformity of the deposited powder bed.

Referring to FIGS. 1 and 4, pre-melt monitoring is then followed by step 402, in which the electron beam is sent to carry out melting across selective areas according to the design data. In step 403 following step 402, post-melt monitoring via electronic imaging of processing area A is optionally carried out to verify fabricated part geometry relative to predefined part geometry (which may include dimensional tolerances) again based on the feedback electron signal received by feedback signal-capturing surface 201. During this step, post-melt electronic imaging may be used to assess the quality of the solidified melted surface 65 by quantifying related topographical features, such as porosity within solidified melted surfaces 65 and deviation in part geometry and the quality of the powder deposition.

During electronic imaging, the electron beam is sent to raster-scan the user-defined region of interest across processing area A in order to generate a digital electronic image or multiple digital electronic images, as known to those skilled in the art. In the example shown in FIGS. 1 and 4, digital electronic images may be generated at high rate due to the short reaction time of the electron beam scan apparatus when the beam is raster-scanning the regions of interest. As a result, a real-time, in situ process monitoring and feedback control system can be achieved on the EBAM host machine. Still referring to FIGS. 1 and 5, monitoring controller 72 executes algorithm 100 to carry out either of pre-melt and post-melt monitoring. Once the digital electronic images are generated, monitoring controller 72 also analyses and interprets the digital electronic images to determine whether the quality of processing area A meets preset specifications. Corrective actions may be carried out if the process specifications are not met. The final process parameters 21-24, which are responsible for both the electron beam properties and the action of powder deposition, may be modified by both monitoring controller 72 and host machine process controller 20 in order to maintain the EBAM process consistency.

Referring again to FIG. 3, apart from being used for electronic imaging, in another preferred embodiment, electronic imaging device 200 may be used as an integrated sensor to provide a time-series feedback signal for real-time in situ EBAM process monitoring. During melting of deposited powder, upon interactions between a primary beam, such as beam 15, and the powder bed, a feedback signal, which may be but is not limited to being provided by SE and BSE, is generated as discussed previously herein and may be captured by any of the feedback signal-capturing surfaces 201. In this preferred arrangement, the feedback signal is then converted to electrical voltage and passed through an instrumentation amplifier 205 for electrical signal conditioning. This analog signal may be sampled and digitized by data logger 206 as discussed previously herein regarding the generation of digital electronic images. As well as being used to form digital electronic images, in this instance, the data logger output voltage, in the form of sensor data 71 which is a time-series signal, may also be used by monitoring controller 72 directly to monitor the EBAM melting process. The magnitude of the feedback signal is influenced by the primary beam properties set to carry out the melting process, such as the beam current and the beam focus. Thus, by monitoring and analyzing the feedback signal in the form of a time-series signal obtained from the EBAM melting process, monitoring controller 72 may be used to assess the quality of the liquid melt zone. Corrective actions may be carried out if the process specifications are not met. The final process parameters 21-24, which are responsible for both the electron beam properties and the action of powder deposition, may be modified by both monitoring controller 72 and host machine process controller 20 to maintain the EBAM process consistency.

Figure 5A:
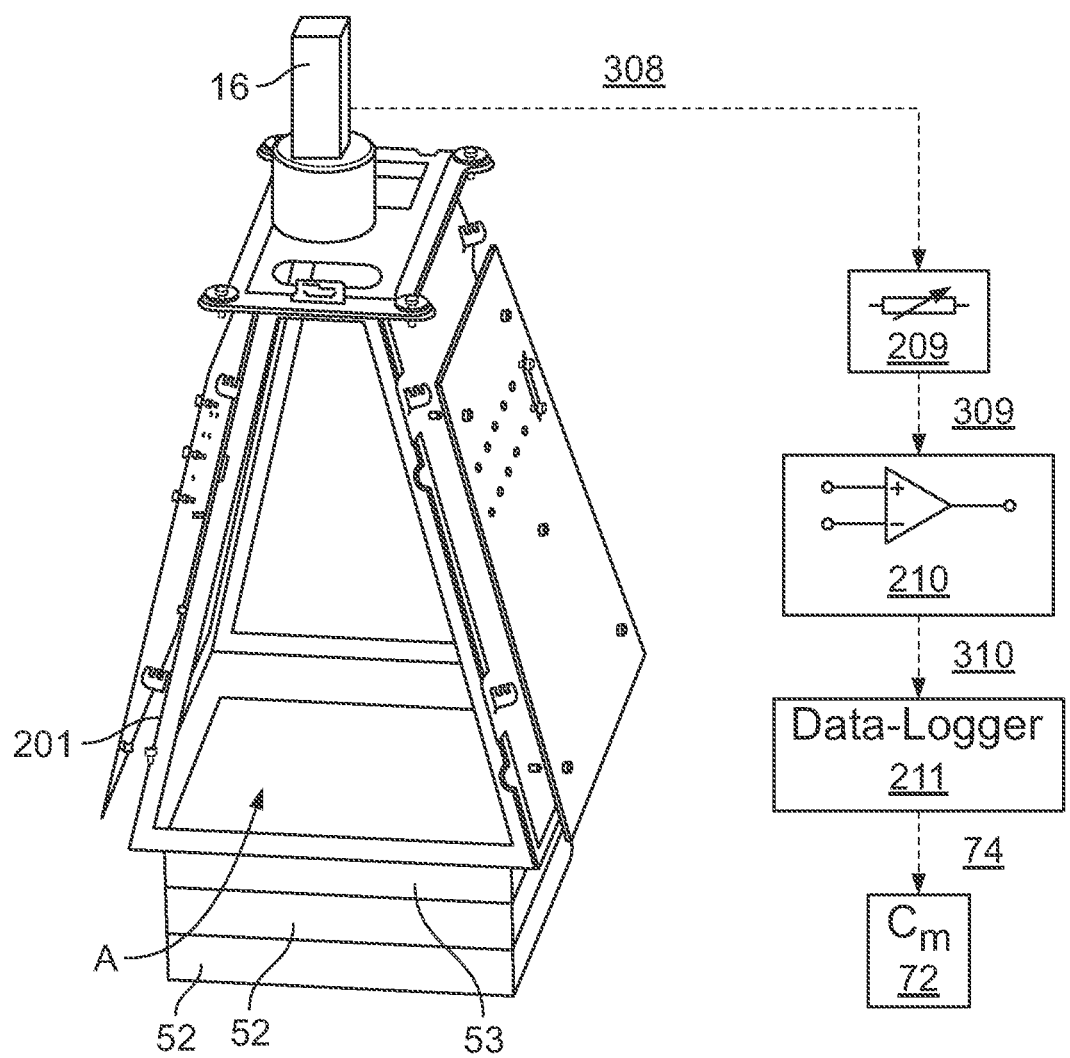
FIG. 5A is a schematic illustration of a feedback radiation collection system.
Figure 5B:
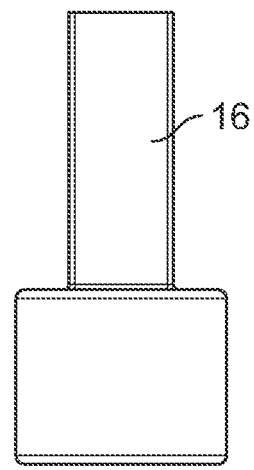
FIGS. 5B and 5C are perspective and cross-sectional views an X-ray detection device of the feedback radiation collection system shown in FIG. 5A.
Figure 5C:
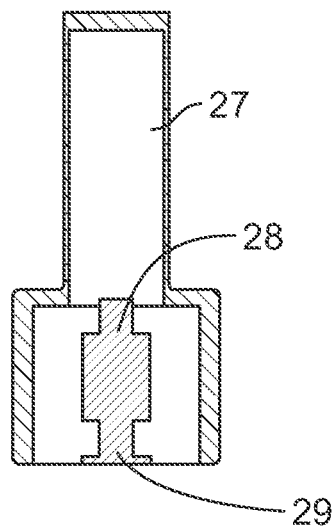

Referring to FIGS. 1, 2 and 5A-5C, as primary electron beam 15 irradiates powder bed 53, electromagnetic radiation is emitted as a consequence of electron-matter interactions. Various design configurations for detecting the feedback radiation are possible. One of sensors 70 may be an energy dispersive X-ray detection device 15, as shown in FIG. 5A, to enable chemical composition quantification during the EBAM process as with energy dispersive X-ray spectroscopy (EDS) in Scanning Electron Microscopes (SEM). The region of interest is scanned by the electron beam in a raster pattern. As the beam interacts with powder bed 53, characteristic X-rays are released. The detection device then converts the energies of X-rays to electrical signals which, after processing, are then plotted as energy against count. From comparison with a database or historical data, chemicals are thus identified and quantified. Referring to FIGS. 5B and 5C, X-ray detection device 16 may be mounted in housing 27 providing vapor protection and thermal regulation and may include X-ray sensor 29 for capturing X-rays as well as vacuum feedthrough 28 for the X-ray sensor and a cable attached to the sensor. As shown, X-ray detection device 16 may be attached to device 200 by way of housing 27. X-ray detection device 16 may be mounted within vacuum chamber 40 in FIG. 1 or partially within it, with direct view of processing area A. In a preferred embodiment, X-ray detection device 16 may have the capability to detect the energy of the electromagnetic radiation exiting powder bed 53, for example by means of a detector and amplifier system. A signal corresponding to the captured electromagnetic radiation may be transmitted in the form of electrical current 308 from the inside of vacuum chamber 40 to a location external to the vacuum through the use of vacuum feed-through 28, as will be understood by those of ordinary skill in the art. There may be many possible embodiments for electrical signal conditioning. Similar to the treatment of signal current 301, current 308 may be converted to a corresponding electrical voltage by passing the current through electrical resistor 209 having a predefined resistance. Signal voltage 309 may be fed to instrumentation amplifier 210 in order to amplify the voltage to a suitable level and generate instrumentation amplifier output voltage 310. Data logger 211 with a suitable data acquisition speed may be used to sample output voltage 310 and perform analog-to-digital conversion (ADC) on the signal. In this manner, the captured feedback radiation then may be transmitted from data logger 211 as sensor data 74 to monitoring controller 72 and processed using algorithm 100. The collected data may be evaluated, for example by constructing spectra, and energy peaks observed may be used to identify composition in the scanned region. By comparing spectra between the melted and powder regions, between layers or with a specified composition, deviations may be identified and used to make process alterations. Data from algorithm 100 is transmitted as a set of input parameters 73 to host machine process controller 20. Final process parameters 21-24, which are responsible for both the electron beam properties and the action of powder deposition, may be modified by both monitoring controller 72 and host machine process controller 20 to maintain the EBAM process consistency.

APPLICATION EXAMPLES

Figure 6:
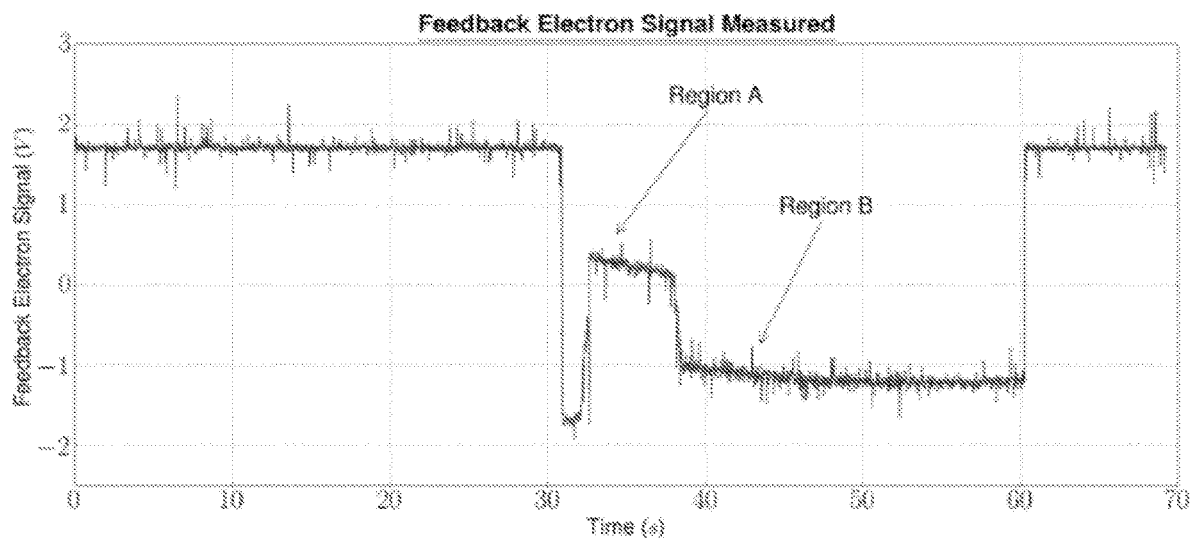
FIG. 6 is a plot of a feedback electron signal received from a user-defined region of interest within the EBAM apparatus as a function of time during an example of the EBAM monitoring and control process shown in FIG. 4.

Example 1: Use of Feedback Electron Signal for Observation and Study of the Electron Beam Additive Manufacturing Process An in situ monitoring system, such as device 200 configured to operate EBAM process monitoring and feedback control process 400 on host machine 1, may be used to observe and study the interactions between the primary electron beam and processing area, melt zone, powder bed and the solidified melted surface for quality verification. A few experiments were carried out using such a system, in which the primary electron beam was sent to raster-scan across a 200 mm×200 mm×2 mm (Width (W)×Depth (D)× Height (H)) stainless steel plate with a 200 mm×50 mm×2 mm (W×D×H) aluminum plate placed on top. A feedback electron sensor in the monitoring system captured the feedback electrons from the processing area during the beam scan while a data logger sampled the obtained signal and relayed the data to a monitoring controller. FIG. 6 is a plot of typical feedback electron signals received from a user-defined region of interest within the EBAM host machine as a function of time. Experimental results showed that interactions between the primary electron beam and the different metallic plates generated different feedback electron yield. Region A in the plot shows the signal level obtained when the primary beam scanned across the aluminum plate while region B shows that when the primary beam scanned across the stainless steel plate. The difference in signal level for the two regions in the plot indicates that the monitoring system is capable of differentiating various metallic materials within the processing area. Results have shown that the in situ monitoring system is capable of monitoring the EBAM process by continuously comparing the feedback electron signal obtained, with a suitable set of reference feedback electron data, in a layer upon layer fashion.

Figure 7:
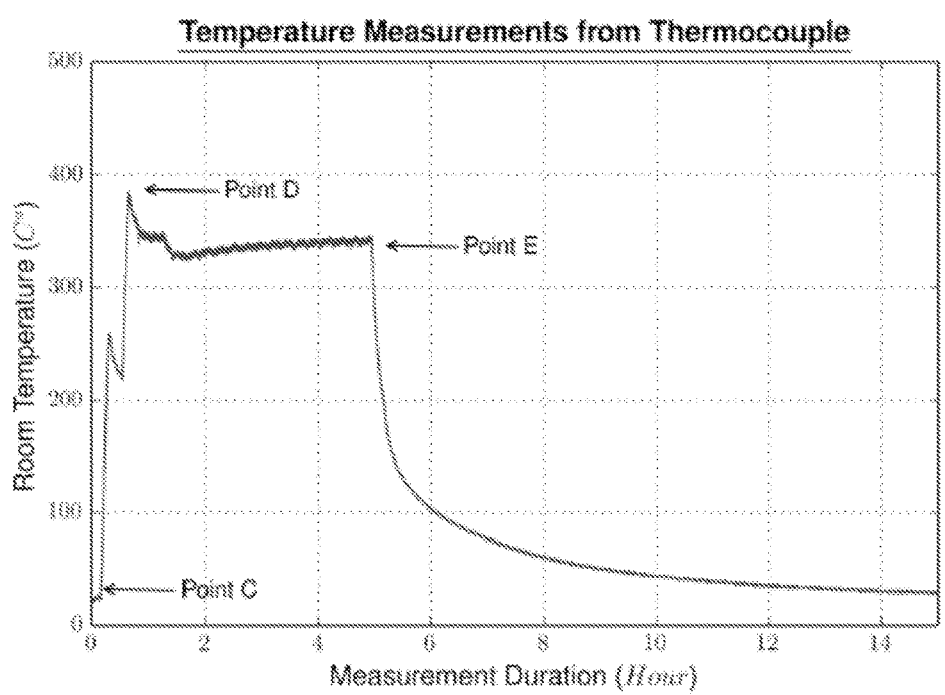
FIG. 7 is a plot of temperature measured within the EBAM apparatus as a function of time during an example of the EBAM monitoring and control process shown in FIG. 4.

Example 2: Use of Feedback Thermal Radiation Signal for Observation and Study of the Electron Beam Additive Manufacturing Process The in situ monitoring system may be used to observe and study the temperature of the processing area, melt zone, powder bed and the solidified melted surface for quality verification. During an experimental build, an EBAM host machine pre-heated its processing area before fabricating a predefined design in a layer upon layer fashion. A feedback thermal radiation sensor in the monitoring system captured the feedback thermal radiation irradiated from the processing area throughout the build while a data logger sampled the obtained signal and relayed the data to a monitoring controller. FIG. 7 is a plot of feedback thermal radiation signals received from a user-defined region of interest within the EBAM host machine as a function of time. The plot shows that the feedback thermal radiation captured by the sensor gives a pattern which reflects the host machine building steps. Point C shows the temperature measured by the sensor when pre-heating started, point D shows such temperature when pre-heating finished, and point E shows such temperature when the build finished. The pattern in the plot implies that the monitoring system can use the temperature data obtained from its sensor as an indication to indirectly estimate the processing area temperature throughout the build. Results have shown that such an in situ monitoring system can monitor the EBAM process by continuously comparing the feedback thermal radiation signal obtained with a suitable set of reference feedback thermal radiation data, in a layer upon layer fashion.

Example 3: Use of Electronic Imaging for Observation and Study of the Electron Beam Additive Manufacturing Process The in situ monitoring system can be used to observe and study the EBAM process by carrying out electronic imaging. A feedback electron sensor, such as device 200, in the monitoring system captures the feedback electrons from the processing area during electronic imaging while a data logger samples the obtained signal and relays the data to a monitoring controller. The monitoring controller runs algorithms to generate digital electronic images from the data relayed from the data logger. The digital electronic images generated allow quality evaluation of the deposition of powder in the powder bed, anomaly detection in the processing area, and geometry deviation quantification of the solidified melted surface. Various sets of experiments were carried out to verify the electronic imaging capability of the monitoring system.

Figure 8A:
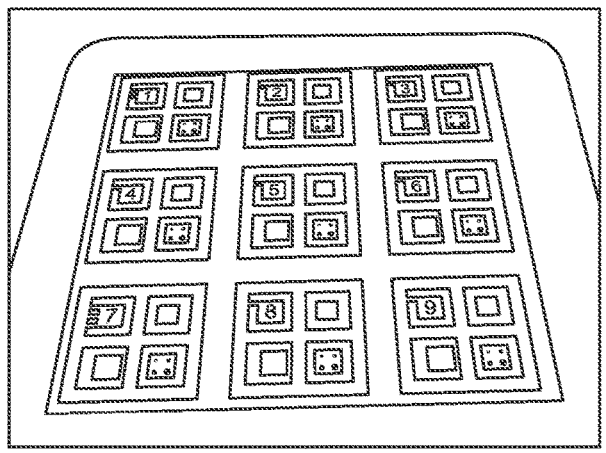
FIGS. 8A-8F are feedback digital electronic images showing user-defined regions of interest with different spatial magnifications during examples of the EBAM monitoring and control process shown in FIG. 4.
Figure 8B:
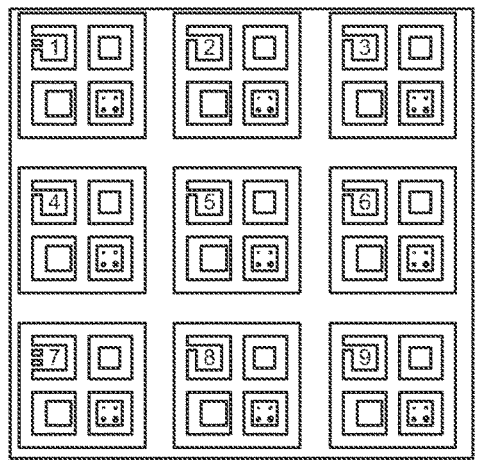
Figure 8C:
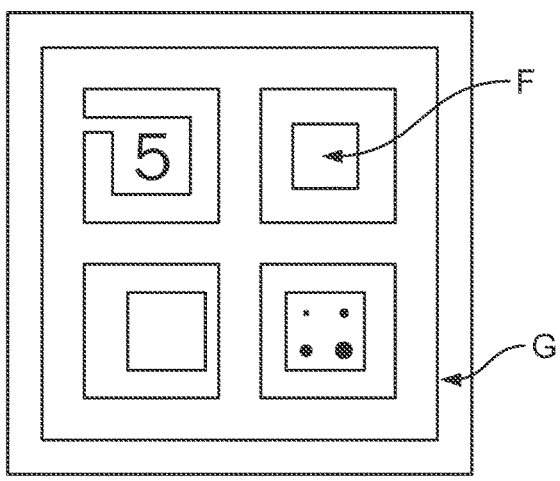
Figure 8D:
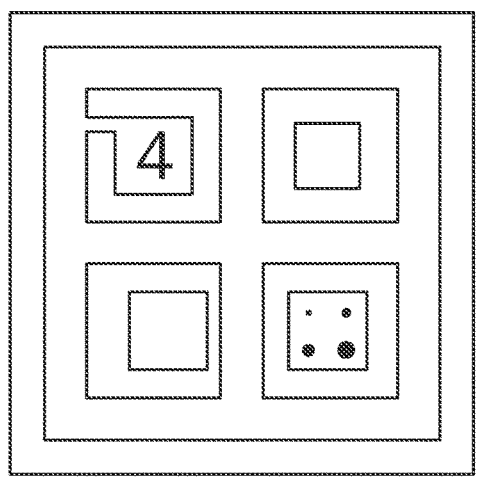
Figure 8E:
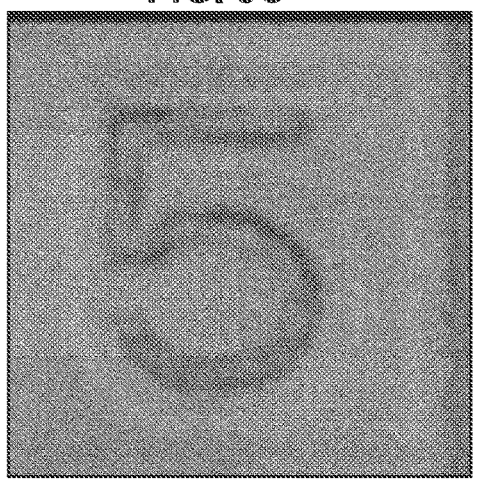
Figure 8F:
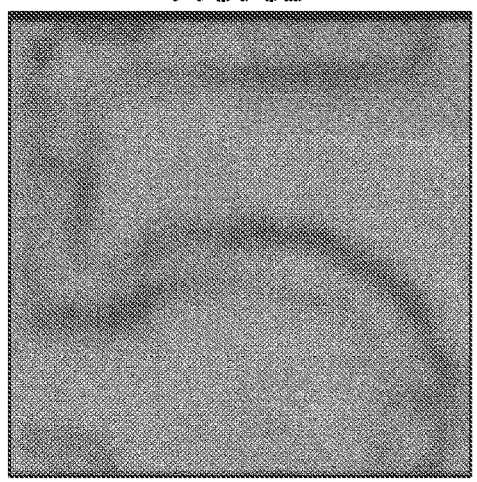

One of the experiments concerned monitoring area and spatial magnification in electronic imaging. A design was first fabricated by an EBAM host machine. The monitoring system then carried out electronic imaging with various user defined settings. FIGS. 8A-8F show the experimental setup and results. FIG. 8A shows the processing area of the EBAM host machine containing a fabricated part. FIGS. 8B-8F show 8-bit grey scale digital electronic images generated from the monitoring system during the experiment. FIG. 8B shows an image having a size of 1800 pixel×1800 pixel, covering a monitoring area of 180 mm×180 mm in the processing area, and having a spatial magnification of 2.7. FIGS. 8C and 8D show two images having a size of 1800 pixel×1800 pixel, covering a monitoring area of 60 mm×60 mm in the processing area, and having a spatial magnification of 8.0. FIG. 8E show an image having a size of 1800 pixel×1800 pixel, covering a monitoring area of 10 mm×10 mm in the processing area and having a spatial magnification of 48.0. FIG. 8F shows an image having a size of 1800 pixel×1800 pixel, covering a monitoring area of 5 mm×5 mm in the processing area, and having a spatial magnification of 95.0. FIGS. 8B-8F demonstrate that the monitoring system is capable of generating digital electronic images with various spatial magnifications. In addition, FIGS. 8C and 8D show that the system is capable of carrying out electronic imaging across various locations of interest in the processing area. Moreover, FIGS. 8B-8D show that there is a difference in pixel intensity between the solidified melted surface, region F, and the powder bed, region G, as shown. The difference in pixel intensity gave rise to an image contrast, which thus distinguished the two regions. Results have shown that the in situ monitoring system may be used to carry out electronic imaging with user-defined settings in spatial magnification and monitoring area. In addition, the success in obtaining a contrast between the solidified melted surface and the powder bed shows that the monitoring controller may be used to distinguish the two regions for monitoring purposes.

In another arrangement, the quality of the deposition of powder and anomalies in the processing area may be detected. In one example, a design may be fabricated by the EBAM host machine. During the build cycles, the monitoring system may carry out electronic imaging to monitor the powder deposition steps of each layer throughout the whole build. 8-bit grey scale Digital electronic images, which may be of an 8-bit grey scale, may be generated from the monitoring system. In one example, such images may all have a size of 1800 pixel×1800 pixel, cover a monitoring area of 180 mm×180 mm in the processing area, and have a spatial magnification of 2.7. The monitoring system may be capable of assessing the quality of powder deposition. Further, the monitoring system may be capable of detecting detached metallization. In some arrangements, the in situ monitoring system may be configured to monitor the EBAM process by continuously comparing the digital electronic images generated by the system with a suitable set of reference images in a layer upon layer fashion.

Figure 9A:
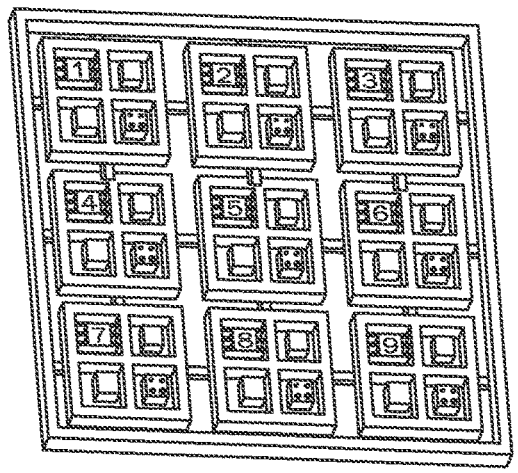
FIGS. 9A-9F are feedback digital electronic images showing part-geometry deviation following examples of the EBAM monitoring and control process shown in FIG. 4
Figure 9B:
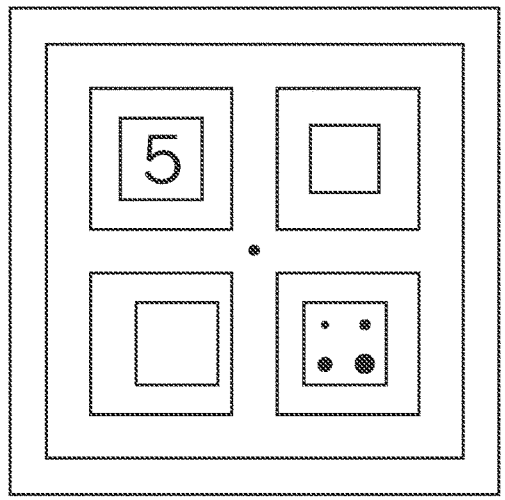
Figure 9C:
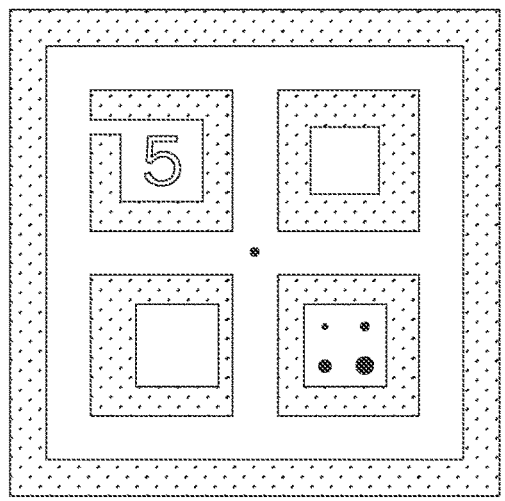
Figure 9D:
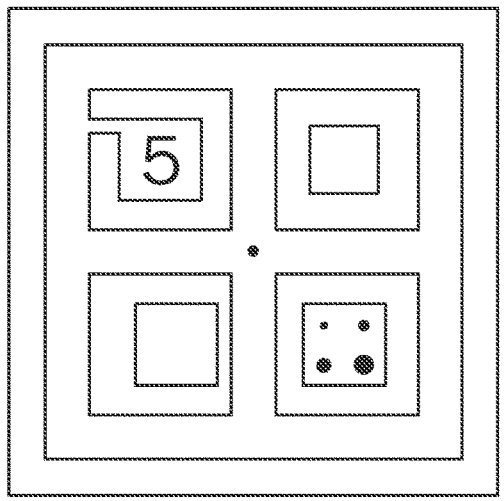
Figure 9E:
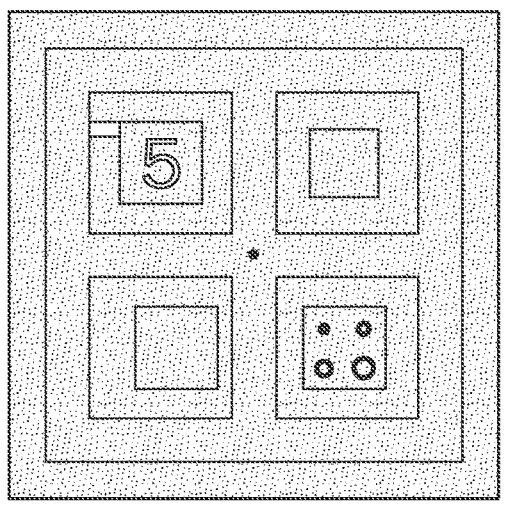
Figure 9F:
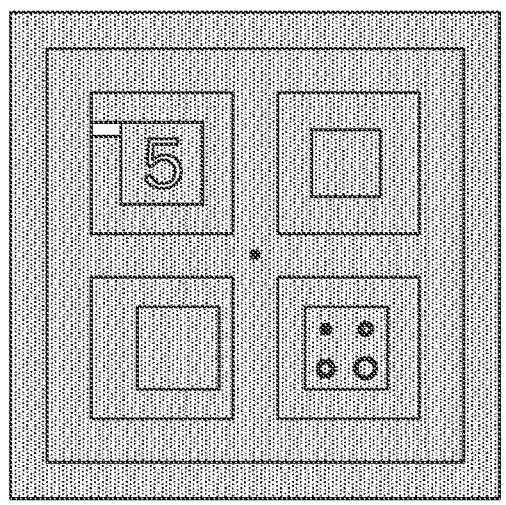

Another experiment concerned analysis of part-geometry post-EBAM process while using the in situ monitoring system. A design was first fabricated by the EBAM host machine. The monitoring system then carried out electronic imaging across a user-defined processing and monitoring area. FIGS. 9A-9F shows the experimental setup and results. FIG. 9A shows the design to be fabricated by the EBAM host machine. FIG. 9B is a binary digital virtual image generated from a cross section which was sliced out from the design. This virtual image has a size of 1800 pixel×1800 pixel and covers a 60 mm×60 mm area in the virtual space. FIG. 9C is a digital electronic image generated from the processing area by the monitoring system. This image has a size of 1800 pixel×1800 pixel, covers the same 60 mm×60 mm area in the processing area as the virtual image in FIG. 9B. FIG. 9D is a binary digital image obtained from carrying out noise reduction, histogram equalization, and thresholding on FIG. 9C. FIG. 9E is the result of an image analysis. FIG. 9B was overlaid on top of FIG. 9D and the differences between the two images are shown in white in FIG. 9E. FIG. 9F is the output of a local thickness analysis using FIG. 9E. The different colors in the image represent different levels of deviation in different areas when comparing the two images in FIGS. 9B and 9D. FIGS. 9A-9F show that the in situ monitoring system can carry out part geometry analysis (post-EBAM process) to evaluate the geometry deviation in the part fabricated by the EBAM process. Results have shown that the in situ monitoring system can monitor the EBAM process by continuously comparing the digital electronic images generated with a suitable set of reference images in a layer upon layer fashion.

In another arrangement, part geometry may be analyzed during an EBAM process while using the in situ monitoring system. The monitoring system may carry out electronic imaging across a user-defined monitoring area while a design is being fabricated by the EBAM host machine. In one example, a design may be fabricated by the EBAM host machine. A binary digital virtual image may be generated from a cross section sliced out from a design layer while the layer is being fabricated. A virtual image, which in this example may have a size of 1800 pixel×1800 pixel and may cover a 60 mm×60 mm area in the virtual space, may be formed. A digital electronic image of the processing area may be generated by the monitoring system once the fabrication of the layer is completed. In this example, the image may have a size of 1800 pixel×1800 pixel and may cover the same 60 mm×60 mm area in the processing area as the virtual image. A binary digital image may be obtained from carrying out noise reduction, histogram equalization, and thresholding. Differences between the virtual and digital electronic images may be assessed using the binary digital image. For example, using a local thickness analysis, different colors in the binary digital image represent different levels of deviation in different areas when comparing the virtual and the digital electronic images. The in situ monitoring system may monitor the EBAM process by continuously comparing the digital electronic images generated with a suitable set of reference images in a layer upon layer fashion. In this manner, the in situ monitoring system may carry out part geometry analysis (during an EBAM process) to evaluate the geometry deviation in the part fabricated by the EBAM process.

Example 4: Use of Feedback Radiation Signal for Observation and Study of the Electron Beam Additive Manufacturing Process The in situ monitoring system can be used to observe and study the X-ray radiation emissions of the processing area, melt zone, powder bed, and the solidified melted surface for quality verification. In one example, the primary electron beam may be deflected to raster-scan across a 200 mm×200 mm×2 mm (W×D×H) stainless steel plate with a 200 mm×50 mm×2 mm (W×D×H) aluminum plate placed on top. A feedback radiation sensor in the monitoring system may be configured to capture the feedback radiation from the processing area during the beam scan while a data logger samples the obtained signal and relays the data to the monitoring controller. Feedback radiation signals received from a user-defined region of interest within the EBAM host machine may be plotted as a function of time. Interactions between the primary electron beam and different materials generate different feedback radiation yields when so plotted. In this manner, differences in signal levels for various regions in plots can be used to identify differences between materials and to evaluate and verify the chemical composition of materials present in the processing area of the EBAM host machine. The in situ monitoring system can monitor the EBAM process by continuously comparing the feedback radiation signal obtained with a suitable set of reference feedback radiation data, in a layer upon layer fashion.

Electron Beam Profile and Location Analyses

Figure 10:
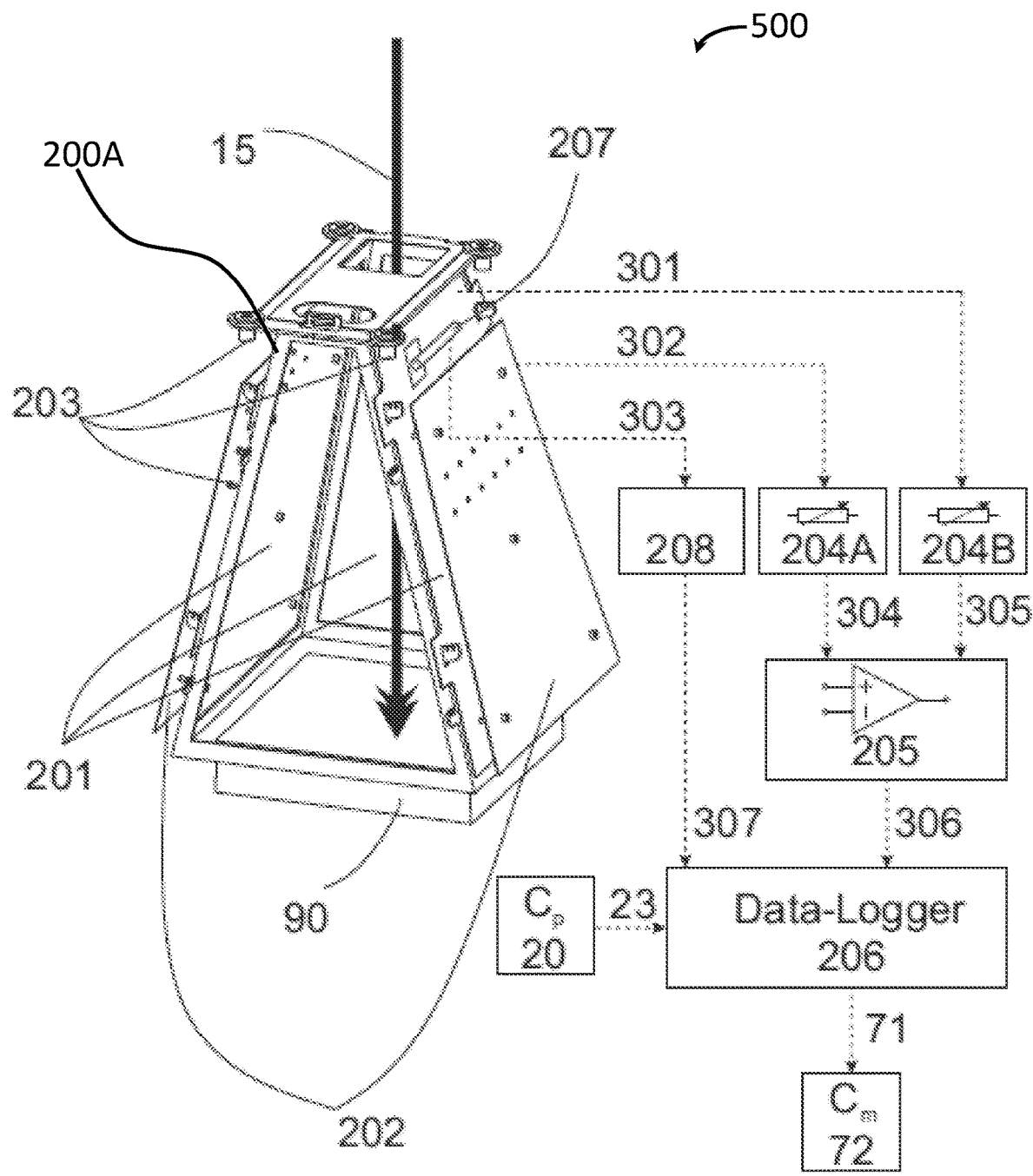
FIG. 10 is a schematic illustration of an electron beam profile and location analyses system.

Referring now to FIG. 10 and with further reference to FIG. 1, additive manufacturing device 1 may be modified to act as an electron beam profile and location analyses (EB-PLA) device. In one example, the modified device is the same as EBAM host machine 1 with the exception that substrate 50 is replaced with substrate 90, which in the example shown in FIG. 10 is an EBPLA plate. This configuration is operable as intended when no powder is deposited onto substrate 90 such that electron beam 15 directly impinges on the substrate when the beam is emitted from electron gun 10. As in examples described previously herein, sensors 70 may be in the form of device 500, which as in the example shown in FIG. 10 may act as an electron beam profile and location analyses device. Although the components of device 500 may be the same when the device acts as the electron beam profile and location analyses device or as the temperature measurement and electronic imaging device, with the exception of the replacement of substrate 50 with substrate 90, certain components such as thermocouple 207 are not required to perform the profile and location analyses and may be removed from device 500 for the intended analyses. However, use of all of the components of device 500 allows the device to function as both the electron beam profile and location analyses device and as the temperature measurement and electronic imaging device during a same fabrication cycle for manufacturing a desired object or set of desired objects.

As described previously herein, a feedback electron signal, in the form of BSE scattered back and SE emitted from substrate 90 upon impingement of electron beam 15 on substrate 90, is captured by feedback signal-capturing surface 201. In light of the captured feedback electron signal, signal current 301 from surface 201 and noise current 302 from noise-filtering plate 202 may be converted to corresponding electrical voltages 304, 305 by passing the currents through respective electrical resistors 204A, 204B, as previously described herein. Respective electrical voltages 304, 305 may be fed through instrumentation amplifier 205 to generate instrumentation amplifier output voltage 306 which may be sampled and digitized by data logger 206 to provide suitable data, such as that plotted in FIGS. 12A, 12B, and 13 described further herein.

Figure 11:
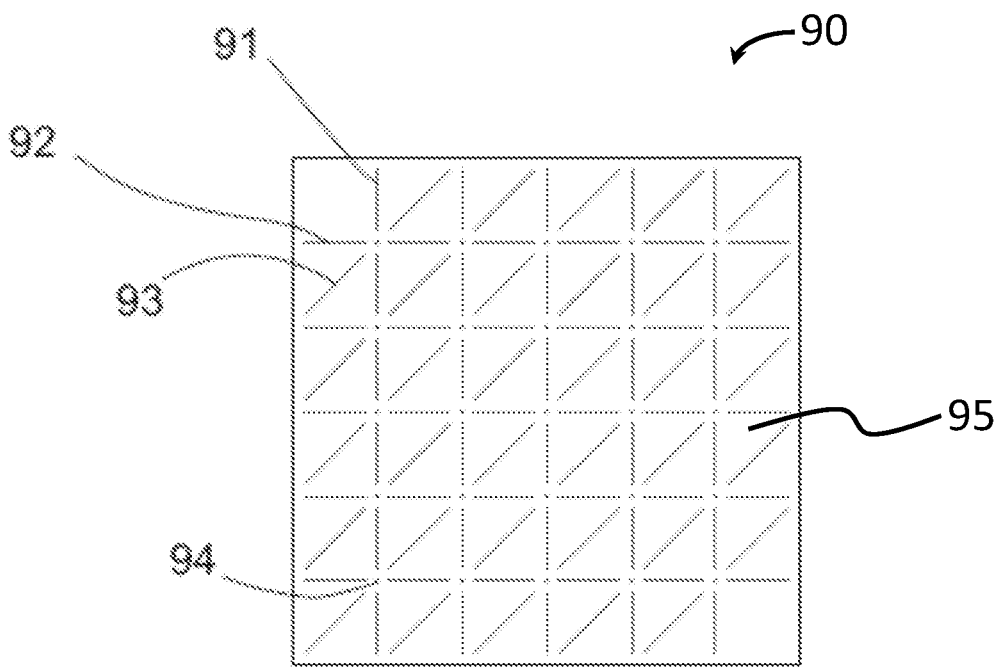
FIG. 11 is a substrate for use with the electron beam profile and location analyses system of FIG. 10.

Referring now to FIG. 11, substrate 90 includes arrays of slits 91, 92, 93 and holes 94, which as in the example shown preferably may be blind holes, i.e., recesses, arranged in a preset pattern within body 95 of the substrate. The slits include vertical slits 91, horizontal slits 92 defining a 90 degree angle with adjacent vertical slits, and diagonal slits 93 defining a 45 degree angle with adjacent horizontal slits and a 45 degree angle with adjacent vertical slits As shown, two vertical slits 91, two horizontal slits 92, and two diagonal slits 93 are arranged around and extend from a center located at holes 94. Vertical slits 91 and horizontal slits 92 are spaced apart equal distances from adjacent vertical and horizontal slits, respectively, such that the combination of the set of vertical slits and the set of horizontal slits generally define a grid of equally sized squares. Diagonal slits 93 generally divide each such square diagonally in half with the exception of opposing squares in the corners of substrate 90, which itself is in the shape of a square. Each of slits 91, 92, 93, as well as holes 94, may be engraved into substrate 90. As described further herein, a reduction in feedback electron signals emitted from substrate 90 and impinged upon feedback signal-capturing surface 201 is assessed when electron beam 15 is scanned, e.g., deflected, across any one of slits 91, 92, 93 at a preset or otherwise known scanning speed over a given time interval to ascertain a profile of the beam. As used herein, the term "beam profile" refers to a two-dimensional (2-D) shape and size of the electron beam at the intersection with substrate 90, which are defined by characteristics of the beam including but not limited to any one or any combination of an overall shape, one or more beam diameters, a beam astigmatism condition, and a beam focus condition of the electron beam of the electron beam. To provide useful data, slits 91, 92, 93 preferably should have a preset cross-sectional dimension in a widthwise direction, i.e., slit width, the width of the slits being less than the length of the slits, that is less than a diameter of the beam. The array of slits 91, 92, 93 allows for assessment of the profile of beam 15 when the beam is deflected onto to substrate 90 at various positions, and thus at various angles as the beam is generally deflected by a rotatable mirror at a static location above the substrate, although in some arrangements the mirror may be both translatable in a plurality of directions and rotatable in a plurality of directions.

Figure 12:
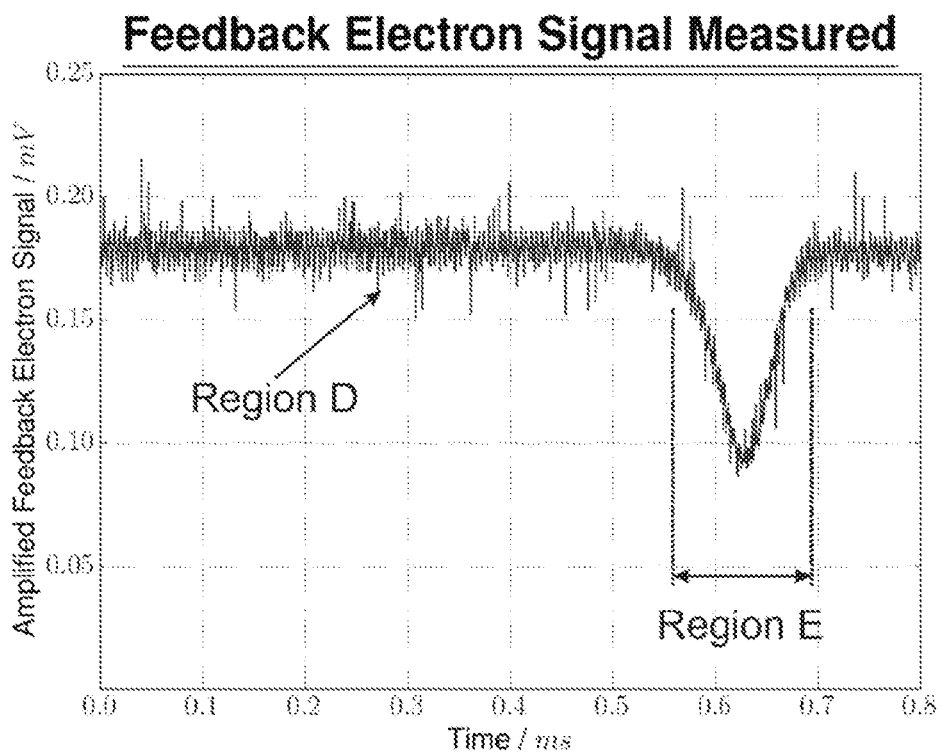
FIGS. 12-13B are plots of amplified output voltages corresponding to feedback electron signals as a function of time during use of the electron beam profile and location analyses system of FIG. 10.

With reference to FIG. 12, in operation, amplified output voltage 306 corresponding to the feedback electron signal from substrate 90 remains at approximately the same level, in the example shown at approximately 0.18 mV as identified in "Region D" in FIG. 12, when electron beam 15 is scanning across body 95 of the substrate. The amplified output voltage 306 drops proportionately to the depth at the particular location of respective slits 91, 92, 93 across which electron beam 15 is scanning, as shown by "Region E" in the example of FIG. 12. In the example shown, the amplified output voltage drops to a minimum of approximately 0.09 mV as shown near the center of Region E.

With further reference to FIG. 12, the length of Region E corresponds to an approximate time that the electron beam is scanning across one of respective slits 91, 92, 93, which in the example shown corresponds to approximately 0.13 milliseconds (ms). With a given, i.e., controlled, scan speed of electron beam 15, which may be set by machine process controller 20, and predetermined cross-sections of slits 91, 92, 93, the time at which the electron beam is measured to be scanning across any one of respective slits 91, 92, 93 varies with the profile of the electron beam such that a profile across a diameter of the electron beam in the direction of movement of the electron beam as measurements are taken is determined from the length of Region E in a given plot of amplified output voltage as a function of time. Preferably, electron beam 15 is scanned across slits 91, 92, 93 in an orthogonal direction to the direction that the slit extends. In some arrangements, the scan speed of electron beam 15 may be at least approximately 100 mm/s, and preferably in the range of approximately 100 mm/s-500 mm/s, and more preferably may be consistently approximately 120 mm/s, 240 mm/s, or 480 mm/s. The scan speed is preferably as fast as possible within the limitations of the EBAM machine, including the capability of data logger 206 to sample sufficient data to ascertain the beam profile.

Scanning beam 15 across each of slits 91, 92, 93 provides data for additional plots of amplified output voltage as a function of time such that a profile of the electron beam across three different diameters of the beam. From the length of Region E in each of the plots, a shape of electron beam 15 may be determined. For comparison, the lengths of Region E taken in the multiple plots for a circular beam will vary from the lengths of Region E for an oval, non-circular beam. In alternative arrangements, additional slits at other angles to respective vertical slits 91 and horizontal slits 92 may be included on a substrate substantially similar to substrate 90 such that a profile across additional diameters of electron beam 15 may be measured.

In analyzing the beam profile, preferably most or more preferably an entirety of the amplified feedback electron signal is analyzed. Thus, such analysis may include the analysis of the electron beam as the beam traverses multiple slits 91, 92, 93, i.e., the analysis of multiple Region Es in the same plot. The determined profile is compared to a desired profile, which may be set by specification. If the determined profile is outside the specification, then parameters of the electron beam affecting the profile are adjusted. In some such arrangements, focus apparatus 13, such as that used in conjunction with EBAM host machine 1, may be adjusted as known to those skilled in the art to change either or both of the general shape and the focus of the electron beam thereby adjusting the profile of the beam.

Referring again to FIG. 11, the array of holes 94, which in the example shown are blind holes for providing locational information of beam 15, are equally spaced apart from other such holes in a grid pattern. Like the slits, holes 94 may be engraved into substrate 90. As described further herein, a reduction in feedback electron signals emitted from substrate 90 and impinged upon feedback signal-capturing surface 201 is assessed when electron beam 15 is deflected across holes 94 along a preset trajectory, which may be measured as amplified output voltage 306 (in the same manner as is done with slits 91, 92, 93 for use in ascertaining the beam profile), to ascertain a locational offset from the preset trajectory and thus determine the need for beam deflection and scan speed calibration.

Figure 13A:
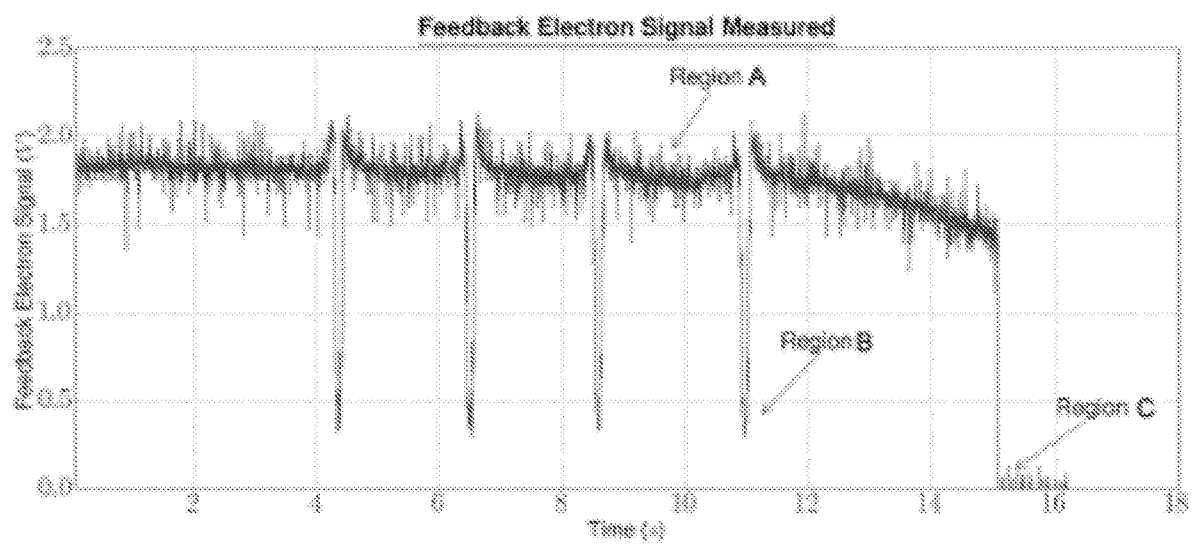
Figure 13B:
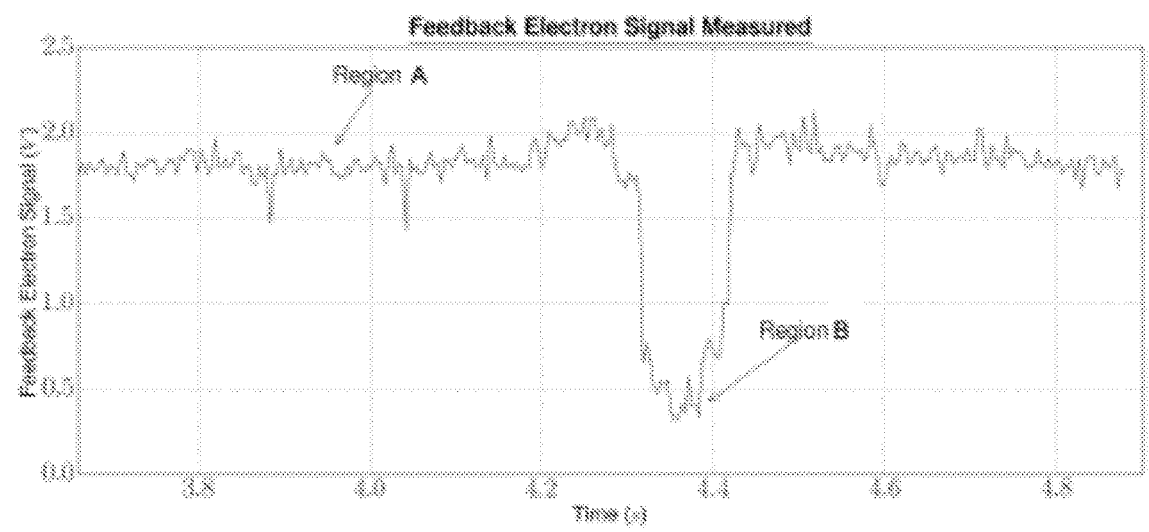

With reference to FIGS. 13A and 13B, amplified output voltage 306 may be plotted for use in identifying the locations of holes 94. "Region A" identified in the plots shown in FIGS. 13A and 13B illustrates amplified output voltage 306 corresponding to the feedback electron signal from substrate 90, which in the example shown is at approximately 1.8 V, when electron beam 15 is scanning across body 95 of the substrate. "Region B" identified in the plots shown in FIGS. 13A and 13B illustrates amplified output voltage 306 when electron beam 15 is scanning across a deepest portion of certain of the plurality of holes 94. In this example, the deepest portion of holes 94 corresponds approximately to the center of such holes. With a given, i.e., constant, scan speed of electron beam 15, the time interval between the deepest portion of any two holes 94, e.g., adjacent holes, is then compared to the expected time interval for the beam to travel the known distance between the two holes at the given scan speed. For example, the time interval between the first two Region B valleys in FIG. 13A is approximately 2.2 seconds whereas the expected time interval for the electron beam to travel across substrate 90 between the holes across which the beam was scanned to take the measurements may be 2.0 seconds. Based on the 0.2 second differential, beam deflection and scan speed may be calibrated appropriately, e.g., by adjusting either or both of scan apparatus 14 and process controller 20. The calibration, or further calibrations, then would be verified by taking additional measurements of the electron beam profile as described previously herein. "Region C" identified in the plot shown in FIG. 13A illustrates amplified output voltage 306 when electron beam 15 is turned off. As such, Region C illustrates noise measured in EBAM host machine 1 at a given time.

In analyzing the beam location, preferably most or more preferably an entirety of the amplified feedback electron signal is analyzed. Thus, such analysis may include the analysis of the electron beam as the beam traverses multiple holes 94, i.e., the analysis of multiple Region Bs in the same plot.

Figure 14:
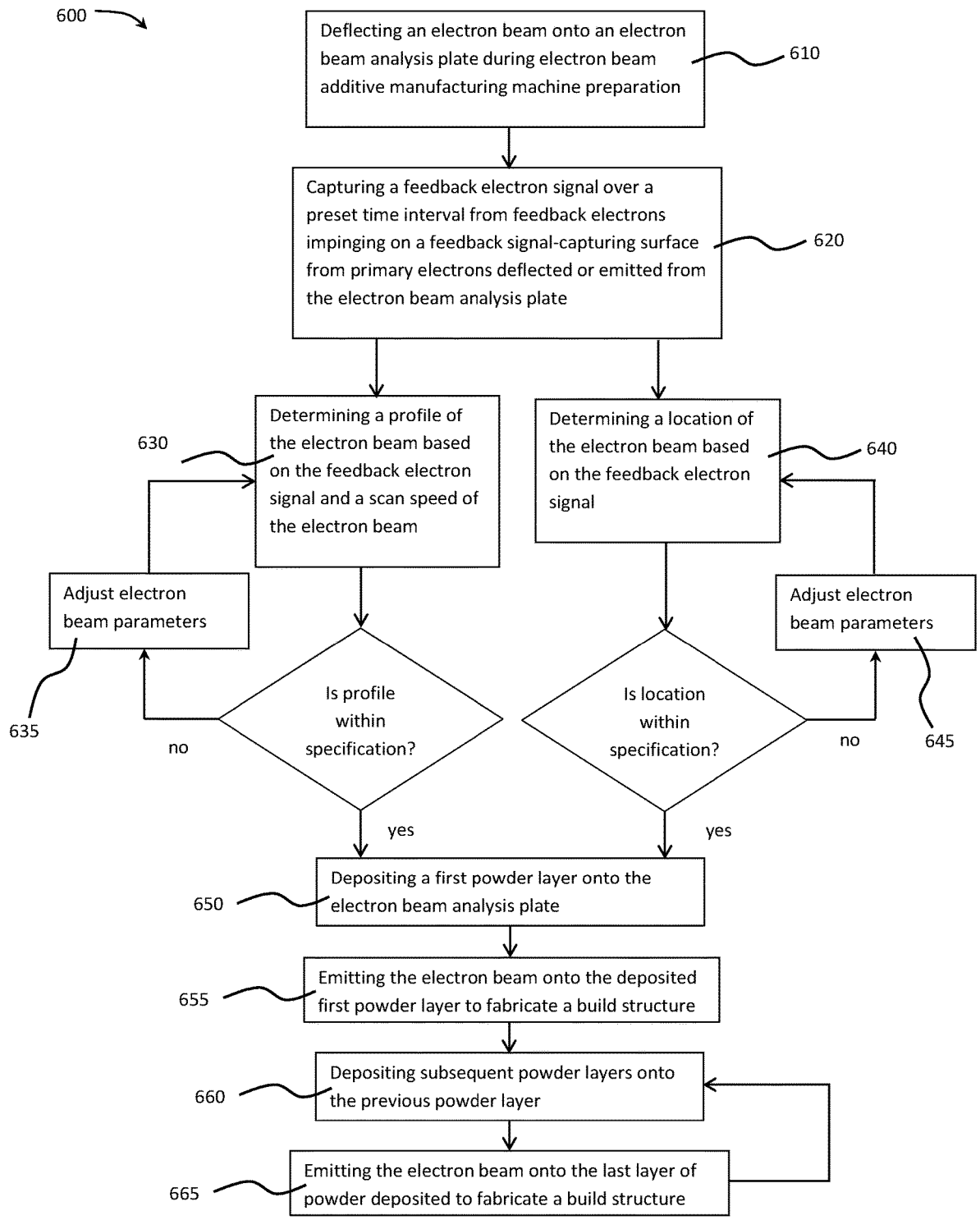
FIG. 14 is a high-level process flow diagram of an EBAM control process.

Referring now to FIG. 14, EBAM control process 600 analyzes a profile and location of an electron beam to calibrate an EBAM host machine. At step 610, an electron beam, e.g., electron beam 15, is deflected onto an electron beam analysis plate, e.g., substrate 90, during preparation of the EBAM host machine prior to the start of a build. At step 620, a feedback electron signal is captured over a preset interval of time from feedback electrons impinging on a feedback signal-capturing surface, e.g., feedback signal-capturing surface 201 of electron beam profile and analyses device 500, from primary electrons deflected or emitted from the electron beam analysis plate. At step 630, a profile of the electron beam is determined based on the feedback electron signal and a scan speed of the electron beam as set forth previously herein with respect to device 500. The determined profile is compared to a desired profile, which may be set by specification. If the determined profile is outside the specification, then parameters of the electron beam affecting the profile are adjusted. In some such arrangements, focus apparatus 13, such as that used in conjunction with EBAM host machine 1, may be adjusted as known to those skilled in the art to change either or both of the general shape and the focus of the electron beam thereby adjusting the profile of the beam. At step 640, a location of the electron beam based on the feedback electron signal is determined. The determined location is compared to an expected or preset location of the electron beam. If the expected or preset location differs from the determined location, then parameters of the electron beam affecting the aim, i.e., targeting, of the electron beam are adjusted. In some such arrangements, scan apparatus 14, such as that used in conjunction with EBAM host machine 1, may be adjusted to change the direction of the beam and thus the location of the beam as the beam impinges on the substrate. For example, the angle or angles of one or more mirrors of scan apparatus 14 may be adjusted to alter the deflection of the beam, as known to those skilled in the art. In some arrangements, both of steps 630 and 640 may be performed during a single scan of the electron beam. In some arrangements, only one of steps 630 and 640 may be performed. If the electron beam profile and location are within specification or otherwise considered to be acceptable, then at step 650, a first layer of powder, e.g., conductive powder 33, is deposited onto the substrate. At step 655, the electron beam is emitted onto the first powder layer deposited onto the substrate to form a layer of a build structure to be fabricated. At step 660, additional powder is deposited onto the previous powder layer, e.g., a second powder layer is deposited onto the first powder layer. At step 665, the electron beam is emitted onto the most recent powder layer deposited, e.g., the second powder layer when the second powder layer is the most recently deposited layer. Steps 660 and 665 may then be repeated until the build structure is fully fabricated, e.g., a third powder layer may then be deposited onto the second powder layer followed by the emission of the electron beam onto the third powder layer.

The ability to use the substrate for both the assessment of electron beam profile and location as well as for fabricating build structures saves significant production time. No additional equipment installation and no vacuum pulling or pressurization of a build chamber following opening of an EBAM host machine to allow for such installation is needed when utilizing EBAM control process 600.

It is to be understood that the disclosure set forth herein includes any possible combinations of the particular features set forth above, whether specifically disclosed herein or not. For example, where a particular feature is disclosed in the context of a particular aspect, arrangement, configuration, or embodiment, that feature can also be used, to the extent possible, in combination with and/or in the context of other particular aspects, arrangements, configurations, and embodiments of the invention, and in the invention generally.

Furthermore, although the invention disclosed herein has been described with reference to particular features, it is to be understood that these features are merely illustrative of the principles and applications of the present invention. It is therefore to be understood that numerous modifications may be made to the illustrative embodiments and that other arrangements may be devised without departing from the spirit and scope of the present invention. In this regard, the present invention encompasses numerous additional features in addition to those specific features set forth in the claims below.

The invention claimed is:

1. An electron beam profile and location analyses system for use in conjunction with an electron beam generation apparatus in assessing and providing feedback on either one or both of a profile and a location of an electron beam emitted from the electron beam generation apparatus, comprising:
   a substrate onto or towards which the electron beam is emitted, the substrate including a top surface and a combination of slits and holes extending from the top surface, each of the holes being between a pair of the slits and each of the slits and the holes being located on the substrate such that the emitted electron beam impinges on one or more of the slits and the holes when the substrate is at a predetermined substrate position and in a predetermined substrate orientation;
   a first plate configured to be electrically insulated from the electron beam generation apparatus and to extend either one or both of over and around the substrate, the first plate electrically conducting a feedback electron signal upon impingement of impinging electrons deflected or emitted from the substrate onto the first plate; and
   a computer system configured for receiving the feedback electron signal from the first plate and interpreting the feedback electron signal for the assessment of the one or both of the profile and the location, relative to the substrate, of the emitted electron beam when the first plate is extended the one or both of over and around the substrate while the first plate is at a predetermined plate position and in a predetermined plate orientation and the substrate is at the predetermined substrate position and in the predetermined substrate orientation relative to the substrate.

2. The system of claim 1, wherein the first plate is configured to extend over the substrate in a direction non-orthogonal and nonparallel to a plane defined by the substrate.

3. The system of claim 1, wherein the substrate includes fiducial markers located on the substrate such that the impinging electrons impinge thereon when the substrate is at the predetermined substrate position and in the predetermined substrate orientation.

4. The system of claim 1, wherein some of the slits extend in a first direction, some of the slits extend in a second direction perpendicular to the first direction, and some of the slits extend in a third direction transverse to the first direction and the second direction.

5. The system of claim 1, wherein the computer system provides visual data for the assessment of or assesses the location of the emitted electron beam, and wherein the slits and the holes are recesses and blind holes, respectively, preset at locations within the plate such that the feedback electron signal provides location data corresponding to an approximately real-time location of the emitted electron beam.

6. The system of claim 1, wherein the computer system stores, in a tangible non-transient computer-storage medium of the computer system, scanning speed data corresponding to a scanning speed of the electron beam over a given time interval, wherein the computer system provides visual data for the assessment of or assesses the one or both of the profile and the location of the emitted electron beam by applying an algorithm using feedback electron data determined from the feedback electron signal and the scanning speed data, wherein the feedback electron data corresponds to voltages formed by the impinging electrons over the given time interval, the time interval being a length of time the feedback electron signal is below a reference value, and wherein a majority of the feedback electron signal is below the reference value when the emitted electron beam is directed at respective ones of the slits and the holes.

7. The system of claim 6, wherein the reference value is an average value of the feedback electron signal along a portion or portions of the top surface of the substrate.

8. The system of claim 1, wherein the computer system stores, in a tangible non-transient computer-storage medium of the computer system, scanning speed data corresponding to a scanning speed of the electron beam, wherein the computer system assesses the one or both of the profile and the location of the emitted electron beam by applying an algorithm using feedback electron data determined from the feedback electron signal and the scanning speed data, and wherein the computer system stores, in a tangible non-transient computer-storage medium of the computer system, pattern reference data corresponding to the preset pattern such that the computer system assesses the one or both of the profile and the location of the emitted electron beam by applying the algorithm further using the pattern reference data.

9. The system of claim 8, wherein the computer system includes a process controller, the process controller being configured for directing the electron beam generation apparatus to emit the electron beam such that the electron beam travels across the substrate at the scanning speed, the scanning speed being constant or variable as directed by the process controller.

10. The system of claim 8, wherein the computer system includes a monitoring controller, the monitoring controller being configured for receiving and interpreting the feedback electron signal to assess the scanning speed of the electron beam.

11. The system of claim 1, wherein the computer system provides the visual data for the assessment of or assesses the one or both of the profile and the location of the emitted electron beam by applying an algorithm using feedback electron data determined from the feedback electron signal and scanning speed data corresponding to the scanning speed of the electron beam.

12. The system of claim 11, wherein the scanning speed data corresponds to one or more scan speeds over a given time interval and the feedback electron data corresponds to voltages formed by the impinging electrons over the given time interval, the time interval being a length of time the feedback electron signal is below a reference value.

13. The system of claim 11, wherein the algorithm includes multiplying an average of the one or more scan speeds over the given time interval by the time interval for the assessment of at least a portion of the profile of the emitted electron beam.

14. The system of claim 1, further comprising a second plate electrically insulated from and attached to the first plate, the second plate providing an electrical noise-filtering surface confronting the first plate.

15. The system of claim 14, wherein the second plate is attached to the first plate by fasteners insulated from the first and the second plates by ceramic components.

16. The system of claim 1, further comprising a frame having a base defining a beam opening for receiving the electron beam and a base opening opposite the beam opening and configured to overlay the substrate.

17. The system of claim 1, wherein the electron beam profile and location analyses system is a temperature measurement and electronic imaging device that further includes a thermal energy sensing device electrically connected with the first plate, the thermal energy sensing device being configured for electrically conducting a thermal energy sensing electrical signal upon receipt of thermal radiation.

18. The system of claim 17, wherein the thermal energy sensing device is a thermocouple, further comprising:
 a first electrical resistor electrically connected to the first plate;
 a second electrical resistor electrically connected to the second plate; and
 a thermocouple amplifier electrically connected to the thermocouple, the thermocouple amplifier providing a feedback electron signal corresponding to the thermal energy sensing electrical signal.

19. An electron beam profile and location analyses system for use in conjunction with an electron beam generation apparatus in assessing and providing feedback on one or both of a profile and a location of an electron beam emitted from the electron beam generation apparatus, comprising:
 a substrate on which an electron beam emitted from the electron beam generation apparatus impinges;
 a frame; and
 a first plate attached to the frame and configured to be electrically insulated from the electron beam generation apparatus and to extend over the substrate and along a portion of the frame in a direction non-orthogonal and nonparallel to a plane defined by the substrate, the first plate electrically conducting a feedback electron signal upon impingement of impinging electrons deflected or emitted from the substrate onto the first plate.

\* \* \* \* \*

UNITED STATES PATENT AND TRADEMARK OFFICE
CERTIFICATE OF CORRECTION

PATENT NO. : 11,117,195 B2
APPLICATION NO. : 16/515725
DATED : September 14, 2021
INVENTOR(S) : Christopher J. Sutcliffe, Eric Jones and Hay Wong It is certified that error appears in the above-identified patent and that said Letters Patent is hereby corrected as shown below:

On the Title Page

Item (72), Inventors: the current text should be replaced with the following:
-- Christopher J. Sutcliffe, Liverpool (GB); Eric Jones, Limerick (IE); Hay Wong, Hong Kong (CN); Lewis Mullen, Englewood, NJ (US) --

Signed and Sealed this
Sixth Day of September, 2022

Katherine Kelly Vidal
*Director of the United States Patent and Trademark Office*